(12) United States Patent
Oh et al.

(10) Patent No.: US 11,527,567 B2
(45) Date of Patent: *Dec. 13, 2022

(54) IMAGE SENSOR

(71) Applicant: SAMSUNG ELECTRONICS CO., LTD., Suwon-si (KR)

(72) Inventors: Young-sun Oh, Yongin-si (KR); Hee-sang Kwon, Hwaseong-si (KR)

(73) Assignee: SAMSUNG ELECTRONICS CO.. LTD., Suwon-si (KR)

( * ) Notice: Subject to any disclaimer, the term of this patent is extended or adjusted under 35 U.S.C. 154(b) by 191 days.

This patent is subject to a terminal disclaimer.

(21) Appl. No.: 16/895,283

(22) Filed: Jun. 8, 2020

(65) Prior Publication Data

US 2020/0303430 A1    Sep. 24, 2020

Related U.S. Application Data

(63) Continuation of application No. 16/410,612, filed on May 13, 2019, now Pat. No. 11,205,672, which is a continuation of application No. 15/698,860, filed on Sep. 8, 2017, now Pat. No. 10,332,925.

(30) Foreign Application Priority Data

Jan. 11, 2017 (KR) .......................... 10-2017-0004169

(51) Int. Cl.
*H01L 27/146* (2006.01)
*H04N 5/361* (2011.01)

(52) U.S. Cl.
CPC ...... *H01L 27/1463* (2013.01); *H01L 27/1464* (2013.01); *H01L 27/14605* (2013.01); *H01L 27/14636* (2013.01); *H01L 27/14612* (2013.01); *H01L 27/14623* (2013.01); *H01L 27/14689* (2013.01); *H04N 5/361* (2013.01)

(58) Field of Classification Search
CPC ........... H01L 27/1463; H01L 27/14605; H01L 27/14636; H01L 27/1464; H01L 27/14612; H01L 27/14623; H01L 27/14689; H01L 27/14603; H01L 27/14614; H04N 5/361
See application file for complete search history.

(56) References Cited

U.S. PATENT DOCUMENTS

| 8,426,238 B2* | 4/2013 | Nishizawa .......... H01L 27/1463 257/E27.122 |
| 9,054,007 B2 | 6/2015 | Hu et al. |
| 9,160,949 B2 | 10/2015 | Zhang et al. |
| 9,373,656 B2 | 6/2016 | Park |

(Continued)

FOREIGN PATENT DOCUMENTS

| JP | 2010-245499 A | 10/2010 |
| WO | 2016/072281 A1 | 5/2016 |

*Primary Examiner* — Su C Kim
(74) *Attorney, Agent, or Firm* — Sughrue Mion, PLLC

(57) ABSTRACT

An image sensor includes a substrate including a plurality of pixel regions and one or more pairs of dummy pixel regions; a pixel separation structure between two adjacent pixel regions among the plurality of pixel regions and including a first conductive layer; a dummy pixel separation structure between the one or more pairs of dummy pixel regions, electrically connected to the pixel separation structure, and including a second conductive layer; and a pixel separation contact disposed on the dummy pixel separation structure.

19 Claims, 17 Drawing Sheets

(56) References Cited

U.S. PATENT DOCUMENTS

| | | | |
|---|---|---|---|
| 10,332,925 B2* | 6/2019 | Oh | H01L 27/14636 |
| 2012/0153127 A1* | 6/2012 | Hirigoyen | H01L 27/14609 |
| | | | 257/E31.127 |
| 2012/0292621 A1 | 11/2012 | Kim et al. | |
| 2014/0110809 A1* | 4/2014 | Kitamura | H01L 27/14623 |
| | | | 438/73 |
| 2014/0131828 A1 | 5/2014 | Isono et al. | |
| 2014/0246707 A1 | 9/2014 | Koo et al. | |
| 2015/0255495 A1* | 9/2015 | Park | H01L 27/14621 |
| | | | 257/446 |
| 2016/0006965 A1 | 1/2016 | Lee et al. | |
| 2016/0111463 A1 | 4/2016 | Borthakur et al. | |
| 2017/0243912 A1 | 8/2017 | Kaneda | |

\* cited by examiner

IMAGE SENSOR

CROSS-REFERENCE TO RELATED APPLICATIONS

This application is a Continuation of U.S. application Ser. No. 16/410,612, filed on May 13, 2019, which is a Continuation of U.S. application Ser. No. 15/698,860, filed on Sep. 8, 2017 in the U.S. Patent and Trademark Office, which claims the benefit of Korean Patent Application No. 10-2017-0004169, filed on Jan. 11, 2017, in the Korean Intellectual Property Office, the disclosures of which are incorporated herein in their entireties by reference.

BACKGROUND

The example embodiments consistent with the example embodiment relate to image sensor and methods for manufacturing the same, and more particularly, to image sensors including a photodiode and methods for manufacturing the same.

In a related art, image sensor is a device that converts an optical image signal into an electrical signal. The image sensor includes a plurality of pixel regions that receive incident light and converts the received light into an electric signal. Each of the plurality of pixel regions includes a photodiode. As a degree of integration of the image sensor has been increased, a size of each of the plurality of pixel regions has been reduced and crosstalk from adjacent pixel regions can occur or a dark current can be generated.

SUMMARY

The example embodiments provide an image sensor capable having a reduced crosstalk or a dark current in pixel regions having a small size.

The example embodiment provide an image sensor which can be manufactured by preventing misalignment in a process of forming a contact in a pixel separation structure between pixel regions having a small size.

According to an aspect of the example embodiments, there is provided an image sensor including: a substrate including a plurality of pixel regions and one or more pairs of dummy pixel regions; a pixel separation structure between two adjacent pixel regions among the plurality of pixel regions and including a first conductive layer; a dummy pixel separation structure between the one or more pairs of dummy pixel regions, electrically connected to the pixel separation structure, and including a second conductive layer; and a pixel separation contact disposed on the dummy pixel separation structure.

According to another aspect of the example embodiments, there is provided an image sensor including: a substrate including a plurality of pixel regions and a plurality of dummy pixel regions; a pixel separation structure between two adjacent pixel regions among the plurality of pixel regions and including a first conductive layer; a dummy pixel separation structure between each of the plurality of dummy pixel regions, electrically connected to the pixel separation structure, and including a second conductive layer; and a pixel separation contact disposed on adjacent two dummy pixel regions among the plurality of dummy pixel regions, and on the dummy pixel separation structure interposed between the two dummy pixel regions.

In one example embodiment, there is an image sensor including: a substrate including a plurality of pixel regions and one or more pairs of dummy pixel regions; a first pixel separation structure disposed between two adjacent pixel regions among the plurality of pixel regions and including a first conductive layer; a dummy pixel separation structure disposed between the one or more pairs of dummy pixel regions, electrically connected to the first pixel separation structure, and including a second conductive layer; and a pixel separation contact disposed on the dummy pixel separation structure.

In yet another example embodiment, there is an image sensor including: a substrate including a plurality of pixel regions and a plurality of dummy pixel regions; a first pixel separation structure disposed between two adjacent pixel regions among the plurality of pixel regions and including a first conductive layer; a dummy pixel separation structure disposed between each of the plurality of dummy pixel regions, electrically connected to the first pixel separation structure, and including a second conductive layer; and a pixel separation contact disposed on adjacent two dummy pixel regions among the plurality of dummy pixel regions, the pixel separation contact being disposed on the dummy pixel separation structure interposed between the two dummy pixel regions.

In one another example embodiment, there is an image sensor including: a substrate; a first plurality of first pixel units formed in the substrate, one of the first plurality of first pixel units being electrically isolated from another of the first plurality of first pixel units by a first insulation structure having a first grid shape, and the one of the first plurality of first pixel units being surrounded by a first conductive structure that is disposed between the one of the first plurality of first pixel units and the first insulation structure; a second plurality of second pixel units formed in the substrate, one of the second plurality of second pixel units being surrounded by a second insulation structure, and the one of the second plurality of second pixel units being adjacently surrounded by a second conductive structure that is disposed between the one of the second plurality of second pixel units and the second insulation structure; and a conductive element disposed over and in contact with the one of the second plurality of second pixel units and another of the second plurality of second pixel units, the conductive element providing electrical communication between one portion of the second conductive structure adjacently surrounding the one of the second plurality of second pixel units and another portion of the second conductive structure adjacently surrounding the another of the second plurality of second pixel units.

BRIEF DESCRIPTION OF THE DRAWINGS

Example embodiments will be more clearly understood from the following detailed description taken in conjunction with the accompanying drawings in which.

DETAILED DESCRIPTION OF THE EXAMPLE EMBODIMENTS

Reference will now be made in detail to example embodiments, examples of which are illustrated in the accompanying drawings.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 1:
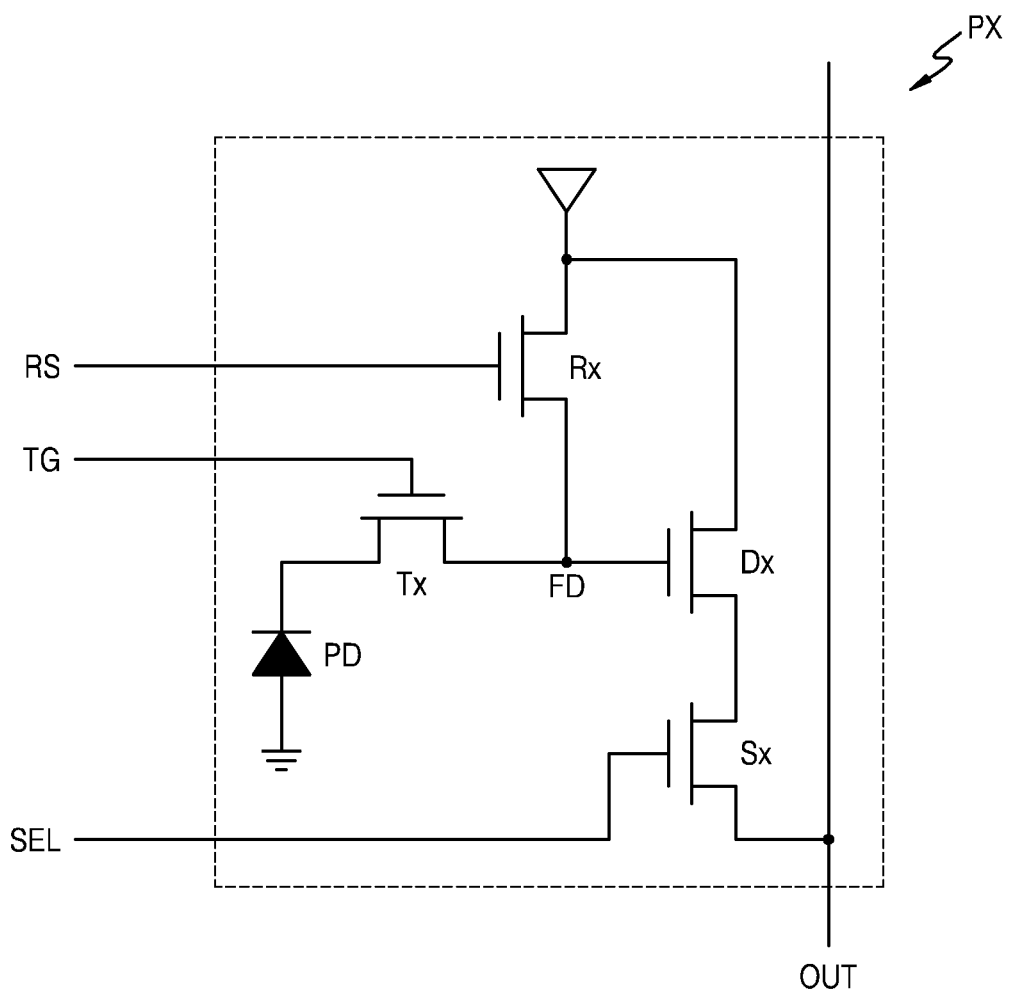
FIG. 1 is a circuit diagram of a unit pixel included in an image sensor according to example embodiments.

FIG. 1 is a circuit diagram of a unit pixel PX included in an image sensor according to example embodiments.

Referring to FIG. 1, the unit pixel PX may include a photoelectric conversion unit PD for receiving light and generating a charge by photoelectric conversion and accumulating the generated charge, a transmission transistor Tx for transmitting the charge generated in the photoelectric conversion unit PD to a floating diffusion region FD, a reset transistor Rx for periodically resetting the charge stored in the floating diffusion region FD, a drive transistor Dx for functioning as a source follower buffer amplifier and buffering a signal according to the charge charged in the floating diffusion region FD, and a selection transistor Sx for switching and addressing in relation to selecting a pixel region PR.

The photoelectric conversion unit PD may be a photodiode including an N-type impurity region and a P-type impurity region. The floating diffusion region FD may be a source of the reset transistor Rx and the floating diffusion region FD may be connected to a gate of the drive transistor Dx. According to FIG. 1, a reset signal RS is applied to a gate of the reset transistor Rx, a transmission signal TG is applied to a gate of the transmission transistor Tx, and a selection signal SEL is applied to a gate of the selection transistor Sx. The reset transistor Rx, the drive transistor Dx, and the selection transistor Sx may be shared by neighboring pixels.

When light is blocked, a power supply voltage is supplied to a drain of the reset transistor Rx and a drain of the drive transistor Dx and the reset transistor Rx is turned on to release charges remaining in the floating diffusion region FD. Thereafter, an electron-hole pair may be generated in the photoelectric conversion unit PD by light that is incident on the photoelectric conversion unit PD when the reset transistor Rx is turned off. The hole may be the P-type impurity region, and the electrons may be transmitted to the N-type impurity region and accumulated. The transmission transistor Tx may be turned on to transmit and/or accumulate the electrons to the floating diffusion region FD. On the other hand, a gate bias of the drive transistor Dx changes according to the amount of charges accumulated in the floating diffusion region FD, and thus a source potential of the drive transistor Dx may be changed. The selection transistor Sx may be turned on to read a signal by charges.

Figure 2:
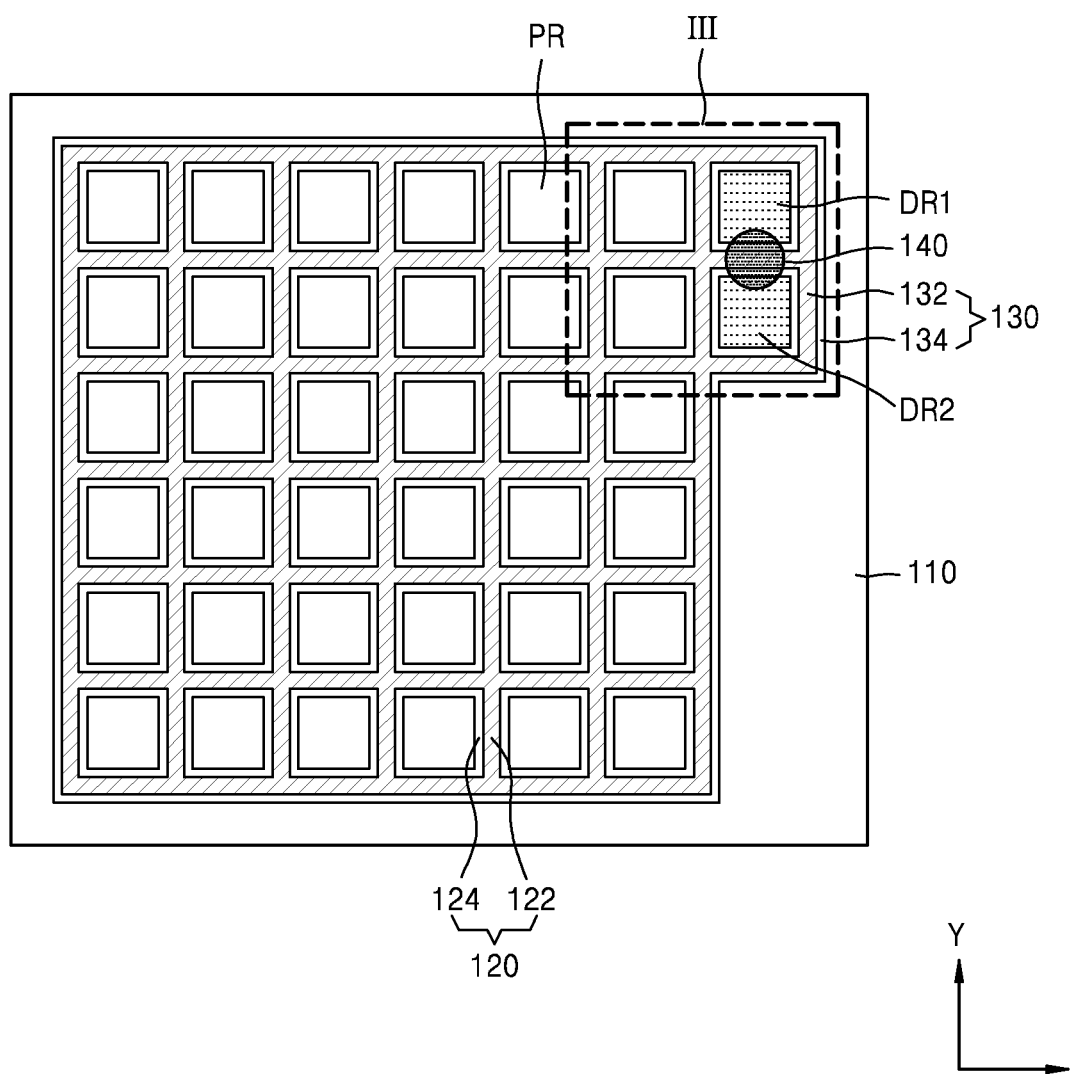
FIG. 2 is a layout of an image sensor according to example embodiments.
Figure 3:
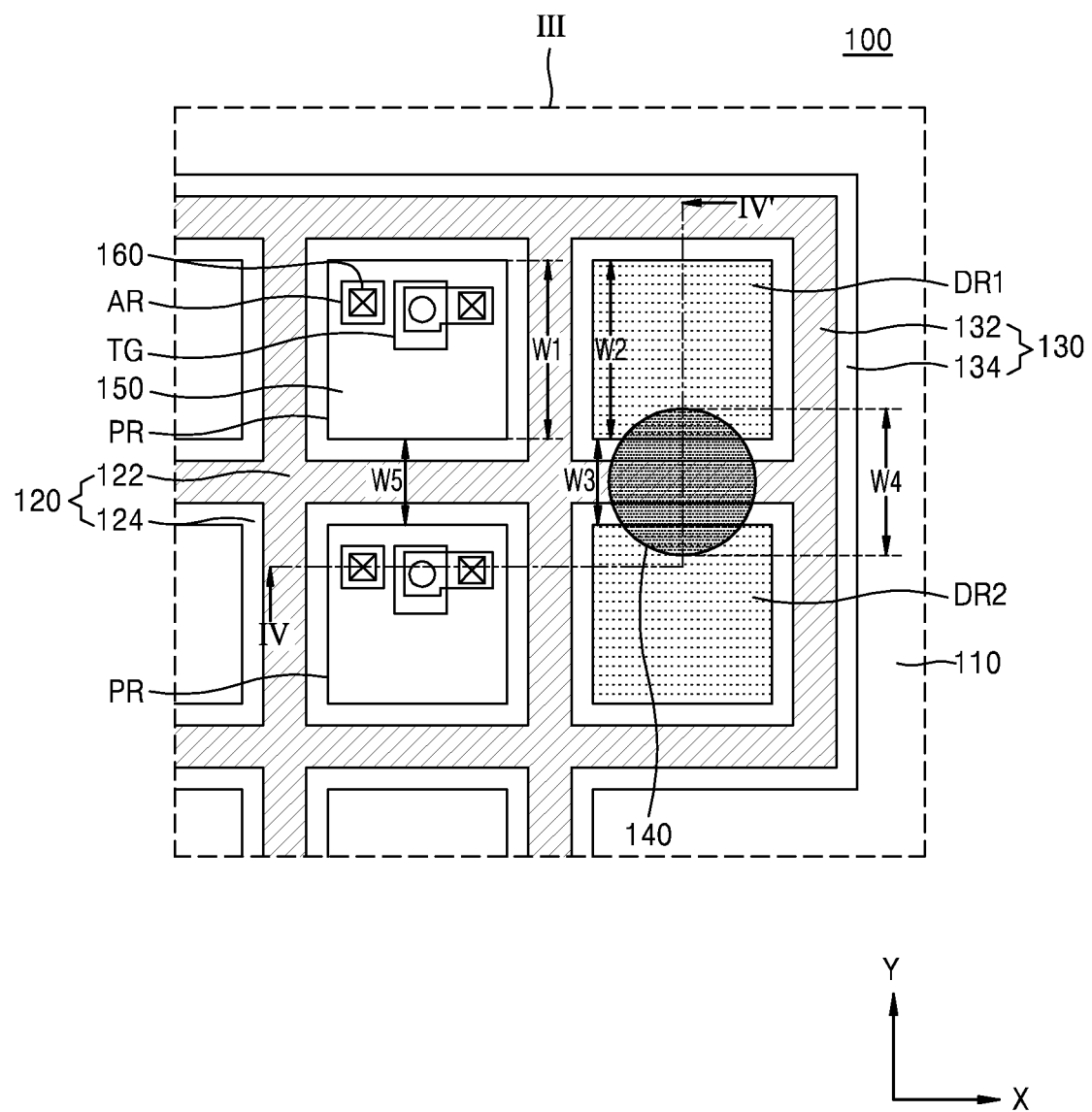
FIG. 3 is an enlarged view of a portion III in FIG. 2.
Figure 4:
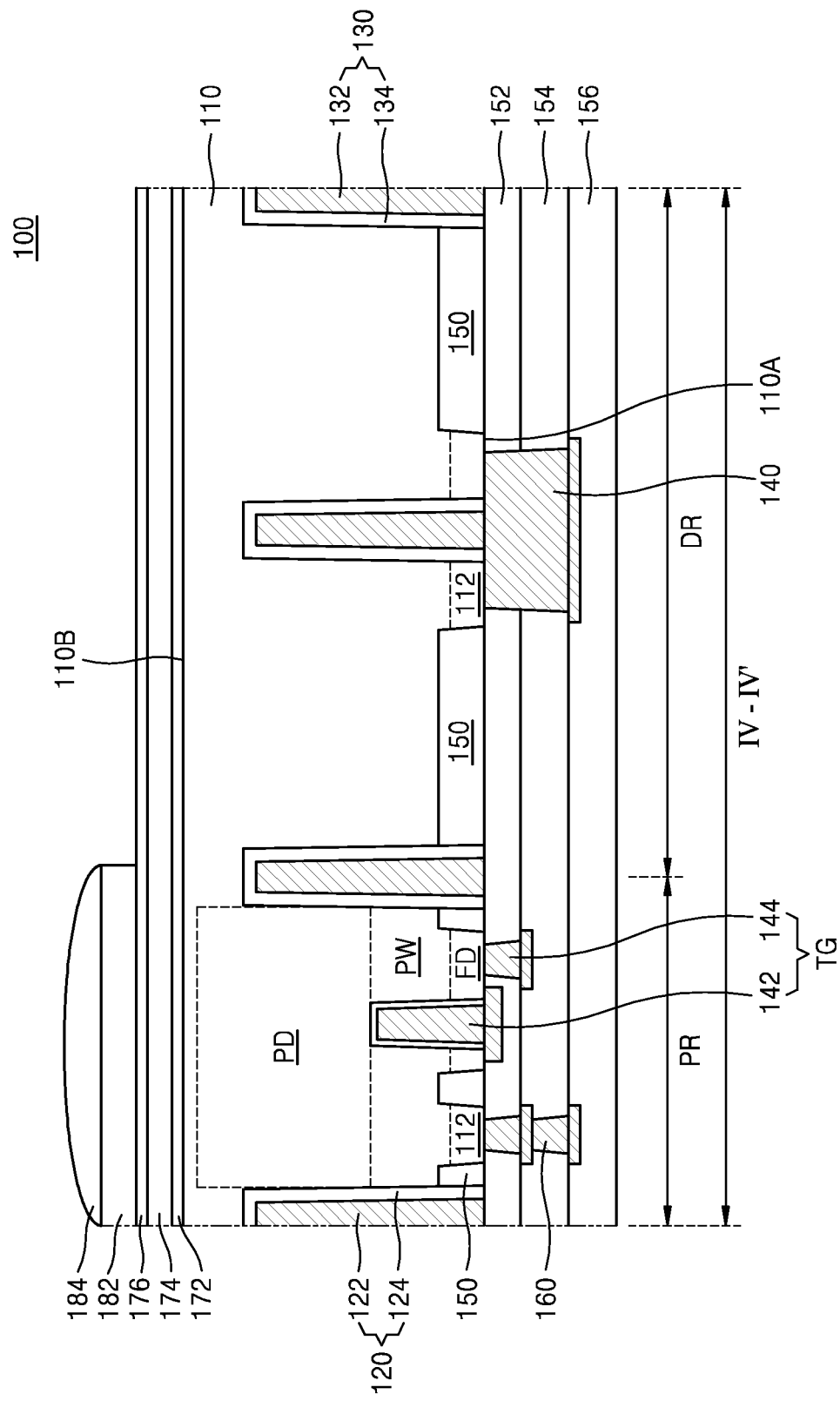
FIG. 4 is a cross-sectional view taken along line IV-IV' in FIG. 3.

FIG. 2 is a layout of an first image sensor 100 according to example embodiments. FIG. 3 is an enlarged view of a portion III in FIG. 2, and FIG. 4 is a cross-sectional view taken along line IV-IV' in FIG. 3. Generally, the first image sensor 100 includes a plurality of pixel regions.

Referring to FIGS. 2 through 4, the first image sensor 100 may include a substrate 110, a plurality of pixel regions PR (e.g., a first plurality of pixel units), a pair of dummy pixel regions DR1 and DR2 (e.g., a second plurality of second pixel units), a pixel separation structure 120 (e.g., a first pixel separation structure, a combination of first insulation structure and a first conductive structure, etc.), a dummy pixel separation structure 130 (e.g., a combination of a second insulation structure and a second conductive structure), and a pixel separation contact 140 (e.g., a conductive element). In an exemplary embodiment, the pair of dummy pixel regions DR1 and DR2 may be at least two dummy pixel regions or two or more dummy pixel regions.

The plurality of pixel regions PR may be arranged in any shape on the substrate 110. For example, as illustrated in FIG. 1, the plurality of pixel regions PR may be arranged in a matrix form in rows and columns along a first direction (for example, an X direction in FIG. 1) parallel to an upper surface of the substrate 110 and a second direction (for example, a Y direction in FIG. 1) perpendicular to the first direction and parallel to the upper surface of the substrate 110.

The pair of dummy pixel regions DR1 and DR2 may be disposed on one side of the plurality of pixel regions PR. One of the pair of dummy pixel regions DR1 and DR2 is referred to as a first dummy pixel region DR1 and the other as a second dummy pixel region DR2. As illustratively shown in FIG. 2, the pair of dummy pixel regions DR1 and DR2 may be arranged in a column along the second direction (the Y direction). For example, the plurality of pixel regions PR may be arranged in an m×n matrix form (where m and n are natural numbers), and the first and second dummy pixel regions DR1 and DR2 may be arranged next to two neighboring pixel regions PR from among the plurality of pixel regions PR, respectively. However, the example embodiment is not limited thereto.

Unlike FIG. 2, the pair of dummy pixel regions DR1 and DR2 may be arranged in a row along the X direction. That is, the first dummy pixel region DR1 may be disposed on one side of one of the plurality of pixel regions PR, and the second dummy pixel region DR2 may be disposed on one side of the first dummy pixel region DR1. Accordingly, the first dummy pixel region DR1 may be disposed between the second dummy pixel region DR2 and the plurality of pixel regions PR.

The pixel separation structure 120 may be disposed between each of the plurality of pixel regions PR. Overall, the pixel separation structure 120 may have a net shape, grid shape or a mesh shape which surrounds each of the plurality of pixel regions PR. One pixel region PR of the plurality of pixel regions PR may be electrically isolated from the other pixel region PR adjacent thereto by the pixel separation structure 120.

In addition, the pixel separation structure 120 may be disposed between the plurality of pixel regions PR and the pair of dummy pixel regions DR1 and DR2. Thus, electrical isolation between the pair of dummy pixel regions DR1 and DR2 and the plurality of pixel regions PR may be obtained.

The dummy pixel separation structure 130 may be disposed between the pair of dummy pixel regions DR1 and DR2 and may be electrically connected to the pixel separation structure 120. For example, the dummy pixel separation structure 130 may be disposed between the first dummy pixel region DR1 and the second dummy pixel region DR2. In addition, the dummy pixel separation structure 130 may be disposed between the pair of dummy pixel regions DR1 and DR2 and the substrate 110. Although not shown in FIG. 2, when a guard ring region (not shown) surrounding the plurality of pixel regions PR and the pair of dummy pixel regions DR1 and DR2 is selectively formed, the dummy pixel separation structure 130 may further be disposed between the pair of dummy pixel regions DR1 and DR2 and the guard ring region.

In example embodiments, the pixel separation structure 120 may include a first conductive layer 122, extending from the upper surface of the substrate 110 and disposed between each of the plurality of pixel regions PR, and a first insulating layer 124 disposed on a sidewall of the first conductive layer 122. The first conductive layer 122 may include at least one of impurity-doped or undoped polysilicon, metal silicide, or a metal-containing layer. The first insulating layer 124 may include silicon oxide, silicon nitride, or silicon oxynitride.

In example embodiments, the dummy pixel separation structure 130 may include a second conductive layer 132, extending from the upper surface of the substrate 110 into the substrate 110 between the pair of dummy pixel regions DR1 and DR2, and a second insulating layer 134 disposed on a sidewall of the second conductive layer 132. The second conductive layer 132 may be electrically connected to the first conductive layer 122. For example, the second conductive layer 132 may be formed integrally with the first conductive layer 122 and electrically connected to the first conductive layer 122.

In example embodiments, the second conductive layer 132 and the second insulating layer 134 may be simultaneously formed via the same process as that used for forming the first conductive layer 122 and the first insulating layer 124, respectively. Also, the second conductive layer 132 and the second insulating layer 134 may include the same materials as those of the first conductive layer 122 and the first insulating layer 124, respectively. In an exemplary embodiment, the first conductive layer 122 is made of a first material and the second conductive layer 124 is made of a second material that is the same as the first material. However, the example embodiment is not limited thereto. The second conductive layer 132 and the second insulating layer 134 may be formed using separate processes from that used for the first conductive layer 122 and the first insulating layer 124, respectively. Here, the second conductive layer 132 and the second insulating layer 134 may include materials different from those of the first conductive layer 122 and the first insulating layer 124, respectively.

The pixel separation contact 140 may be disposed on the pair of dummy pixel regions DR1 and DR2, that are sequentially disposed, and the dummy pixel separation structure 130. The pixel separation contact 140 may be electrically connected to the dummy pixel separation structure 130 so that an electrical path may be provided to the pixel separation structure 120, through the dummy pixel separation structure 130, from the pixel separation contact 140 connected to an external voltage application wiring (not shown). For example, a negative voltage may be applied to the pixel separation structure 120 from the pixel separation contact 140 by operably applying the negative voltage to the dummy pixel separation structure 130. In an example embodiment, the pixel separation contact 140 is configured to receive the negative voltage. It is possible to prevent hole accumulation on a surface of the pixel separation structure 120, particularly on a surface of the first insulating layer 124, when the negative voltage is applied to the pixel separation structure 120. Thus, occurrence of a dark current of the first image sensor 100 may be remarkably reduced. A magnitude of a voltage applied to the pixel separation structure 120 from the pixel separation contact 140 may vary according to layouts and designs of the plurality of pixel regions PR.

In example embodiments, a negative voltage may be applied to the pixel separation contact 140 and some portions of the pair of dummy pixel regions DR1 and DR2 (e.g., an impurity region 112) in contact with the pixel separation contact 140. Other contacts, voltage applying terminals, or voltage applying wirings except for the pixel separation contact 140 may not be connected to the pair of dummy pixel regions DR1 and DR2. Accordingly, the pair of dummy pixel regions DR1 and DR2 may be electrically isolated by the pixel separation structure 120 and the dummy pixel separation structure 130. Even if a negative voltage is applied to the pair of dummy pixel regions DR1 and DR2, no bias may be applied to a plurality of pixel regions PR adjacent to the pair of dummy pixel regions DR1 and DR2.

Hereinafter, an internal structure of each of the plurality of pixel regions PR will be described with reference to FIGS. 1 to 4.

Each of the plurality of pixel regions PR may be separated from an adjacent pixel region PR by the pixel separation structure 120. The pixel separation structure 120 may be disposed in the substrate 110 by extending to a depth adjacent to a second surface 110B opposite to a first surface 110A of the substrate 110, that is, in the Y direction perpendicular to the first surface 110A of the substrate 110.

Although not shown in FIG. 4, an impurity region 194 (of FIG. 16) may be formed in contact with an end of the pixel separation structure 120, and thus each of the plurality of pixel regions PR may be sufficiently electrically isolated from adjacent pixel regions PR among the plurality of pixel regions PR by the pixel separation structure 120 and the impurity region 194. For example, when sizes of the plurality of pixel regions PR are reduced, crosstalk or the like may occur due to light incident on the adjacent pixel regions PR. However, the crosstalk may be reduced as the pixel separation structure 120 and the impurity region 194 provide a sufficient electrical insulating structure between the plurality of pixel regions PR.

Figure 16:
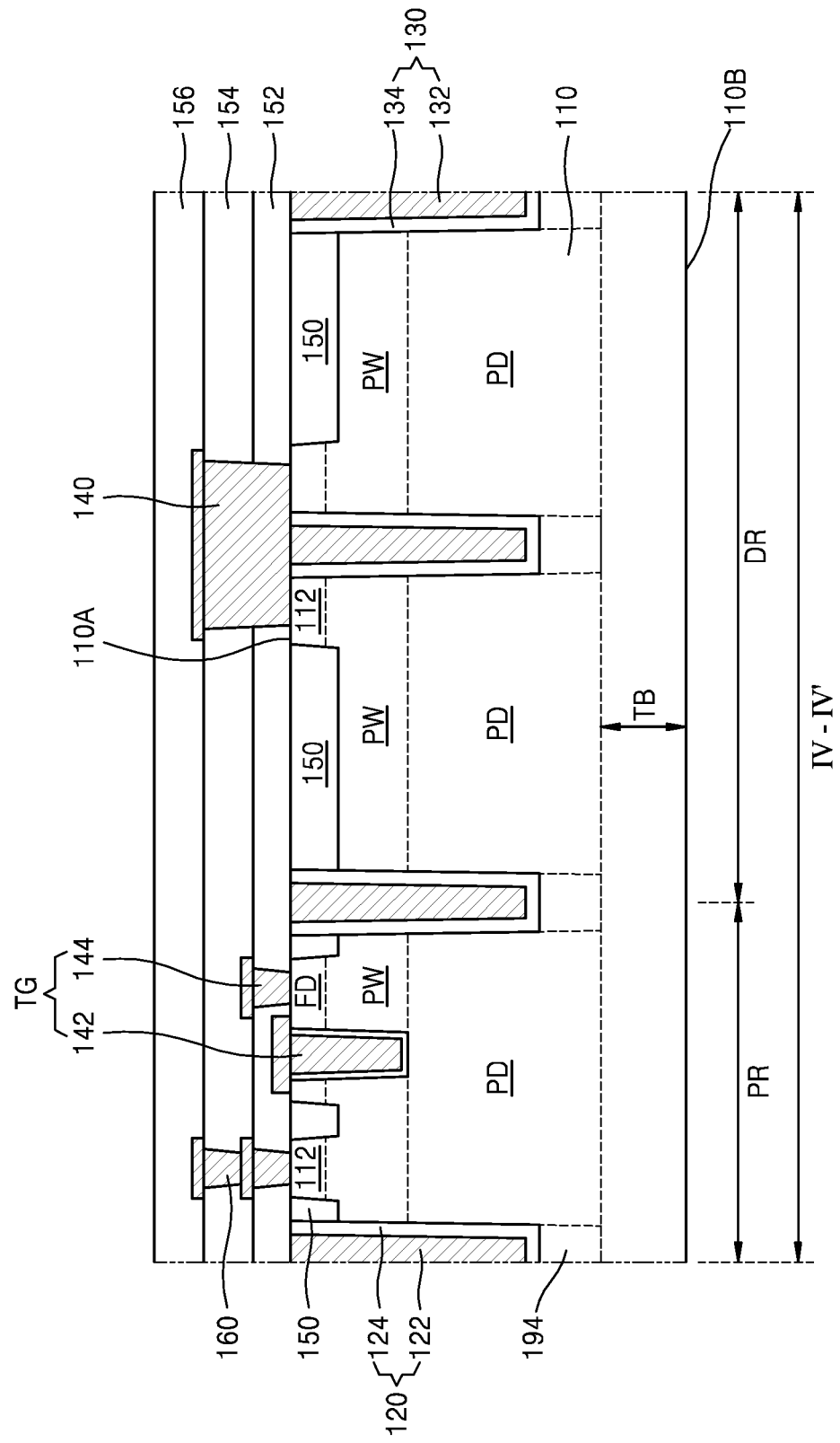

In example embodiments, the impurity region 194 may be a region doped with a P-type impurity. However, the example embodiment is not limited thereto. The impurity region 194 may not be formed when the pixel separation structure 120 extends to a depth close to the second surface 110B of the substrate 110 (e.g., when a separation distance between the pixel separation structure 120 and the second surface 110B of the substrate 110 along the Y direction is very small). In an exemplary embodiment, the impurity region 194 may not be formed when the pixel separation structure 120 extends down to a depth to which the impurity region 194 in FIG. 16 extends. In another exemplary embodiment, the impurity region may not be formed when the pixel separation structure 120 extends down so that a bottom of the pixel separation structure 120 is above the second surface 110B by a distance approximately equivalent to or less than the first thickness TB (FIG. 16).

Each of the plurality of pixel regions PR may include the photoelectric conversion unit PD formed in the substrate 110. The photoelectric conversion unit PD may be, for example, a region doped with an N-type impurity. The photoelectric conversion unit PD may be disposed in contact with or adjacent to the first insulating layer 124 of the pixel separation structure 120. For example, the photoelectric conversion unit PD may be surrounded by the pixel separation structure 120. Since the photoelectric conversion unit PD and the pixel separation structure 120 may be in contact with each other as illustrated in FIG. 4, an area of the photoelectric conversion unit PD, which may be formed in each of the plurality of pixel regions PR, may be relatively increased (e.g., a fill factor may be increased), and thus a sensitivity of the first image sensor 100 may be improved.

FIG. 4 illustratively shows that the photoelectric conversion unit PD and a well region PW are disposed in each of a plurality of pixel regions PR and are not disposed in the pair of dummy pixel regions DR1 and DR2. However, the example embodiment is not limited thereto. The photoelectric conversion unit PD and the well region PW may be disposed in the pair of dummy pixel regions DR1 and DR2 as illustrated in FIG. 16.

In each of the plurality of pixel regions PR, there are a plurality of transistors, including transmission transistor Tx, the reset transistor Rx, drive transistor Dx, and the selection transistor (see FIG. 1), and a connection contact 160 may be disposed on the first surface 110A of the substrate 110. In particular, an isolation layer 150 defining an active region AR may be formed at a predetermined height from the first surface 110A of the substrate 110 (see FIG. 4), and the connection contact 160 and the transmission transistor Tx, the reset transistor Rx, drive transistor Dx, and the selection transistor Sx may be formed on the active region AR.

FIG. 4 may illustratively show a gate TG of the transmission transistor Tx including a gate structure, i.e., a recessed gate structure 142, and a planar gate structure 144. As illustratively shown in FIG. 4, the recessed gate structure 142 of the gate TG of the transmission transistor Tx extends from the first surface 110A of the substrate 110 to a predetermined height so that an end of the recessed gate structure 142 may be electrically connected to a photoelectric conversion unit, i.e., the photoelectric conversion unit PD.

Furthermore, the floating diffusion region FD may be disposed from the first surface 110A of the substrate 110 to a predetermined height and the planar gate structure 144 may be disposed below the floating diffusion region FD. The well region PW may be disposed in a region between the floating diffusion region FD and the photoelectric conversion unit PD in the substrate 110. For example, the floating diffusion region FD may be an impurity region doped with an N-type impurity, and the well region PW may be an impurity region doped with a P-type impurity.

The impurity region 112 may be disposed in the active region AR spaced apart from the gate TG of the transmission transistor Tx. The impurity region 112 may be a region doped with a P-type impurity. For example, the impurity region 112 may function as an intermediate region for the connection contact 160 to which a ground or a power supply voltage is applied. The connection contact 160, which is connected to the impurity region 112, may be disposed on the first surface 110A of the substrate 110 and may have a structure in which a plurality of contacts and a plurality of wiring layers are stacked on each another as illustratively shown in FIG. 4. However, unlike FIG. 4, the connection contact 160 may have a structure in which one contact and one wiring layer are stacked on each another.

Third insulating layer 152, fourth insulating layer 154, and fifth insulating layer 156 may be disposed below the first surface 110A of the substrate 110. The third insulating layer 152, the fourth insulating layer 154, and the fifth insulating layer 156 may cover the sides and the lower portions of the connection contact 160, the sides and the lower portions of the gate TG of the transmission transistor Tx, and the sides and the lower portions of the pixel separation contact 140. An antireflection layer 172, the sixth insulating layer 174 and the seventh insulating layer 176 may be disposed on the second surface 110B of the substrate 110 and a color filter 182 and a micro lens 184 may be disposed on the pixel region PR of the plurality of pixel regions PR.

As illustratively shown in FIG. 3, the pixel region PR of the plurality of pixel regions PR have a first width W1 along the second direction (the Y direction), and the dummy pixel region DR1 of the pair of dummy pixel regions DR1 and DR2 has a second width W2 along the second direction (the Y direction), wherein a second length of the second width W2 may be substantially the same as a first length of the first width W1. Hence, there is, generally, a first pixel separation structure length of a first pixel separation structure width.

Furthermore, as illustratively shown in FIG. 3, the pixel separation contact 140 may be disposed to partially overlap both the pair of dummy pixel regions DR1 and DR2 and the dummy pixel separation structure 130 interposed therebetween. Hence, there is, generally, a dummy pixel separation structure length of a dummy pixel separation structure width. The dummy pixel separation structure 130 has a third width W3 along the second direction (the Y direction) and the pixel separation contact 140 has a fourth width W4 along the second direction (the Y direction), wherein a fourth length of the fourth width W4 may be equal to or greater than a third length of the third width W3. Furthermore, the fourth length of the fourth width W4 may be equal to or less than a sum of the third length of the third width W3 and twice the second length of the second width W2. That is, W3≤W4≤W3+2W2.

In addition, the pixel separation structure 120 has a fifth width W5 along the second direction (the Y direction), wherein a fifth length of the fifth width W5 may be substantially the same as or similar to the fourth length of the fourth width W4 of the dummy pixel separation structure 130. The term "similar to" can be understood that a width of a component is at least about 95%, at least about 90%, at least about 80%, or at least about 70% of a width of the other component.

In general, when a structure in which a contact is directly disposed on the pixel separation structure 120 to apply a voltage to the pixel separation structure 120, is used, a width or a length of a width of the contact needs to be less than the fifth length of the fifth width W5 of the pixel separation structure 120. As a size of the pixel region PR is reduced, a size of the pixel separation structure 120 also needs to be reduced. However, the size reduction of the pixel separation structure 120 may be limited in order to dispose the contact on the pixel separation structure 120 (i.e., the width of the pixel separation structure 120 may be hardly reduced). In addition, an electrical short is likely to occur between the contact and the pixel region PR when misalignment of the contact occurs due to a tolerance that may occur in the process of disposing the contact on the pixel separation structure 120. Hence, there is, generally, a pixel separation contact length of a pixel separation contact width or a pixel separation structure length of a pixel separation structure width.

Furthermore, in order to solve difficulty due to the misalignment or the like, a wide pixel separation structure having a relatively wide width may be additionally formed outside the pixel region PR, and the contact may be disposed on the wide pixel separation structure. However, since a relatively narrow pixel separation structure needs to be formed by a different process than the wide pixel separation structure, the processes may be complicated.

However, according to the first image sensor 100 according to the above-described example embodiments, the pixel separation contact 140 may be disposed to partially overlap both the pair of dummy pixel regions DR1 and DR2 and the dummy pixel separation structure 130 interposed therebetween. Accordingly, even if a tolerance such as misalignment which may occur in a process of forming the pixel separation contact 140 occurs, the pixel separation contact 140 may be stably connected to the inside of the pair of dummy pixel regions DR1 and DR2, so that the likelihood of fabrication defects may be reduced.

In addition, it is not necessary to form the contact on the pixel separation structure 120, which may be advantageous in scaling down the first image sensor 100. Furthermore, since the fifth length of the fifth width W5 of the pixel separation structure 120 and the fourth length of the fourth width W4 of the dummy pixel separation structure 130 are substantially the same or similar to each other, the pixel separation structure 120 and the dummy pixel separation structure 130 may be formed at the same time, and a manufacturing process of the first image sensor 100 may be simplified.

As a result, according to the first image sensor 100 according to the above-described example embodiments, a dark current may be reduced by applying a voltage through the dummy pixel separation structure 130. In addition, the likelihood of fabrication defects due to contact misalignment in the manufacturing process of the first image sensor 100 may be reduced.

Figure 5:
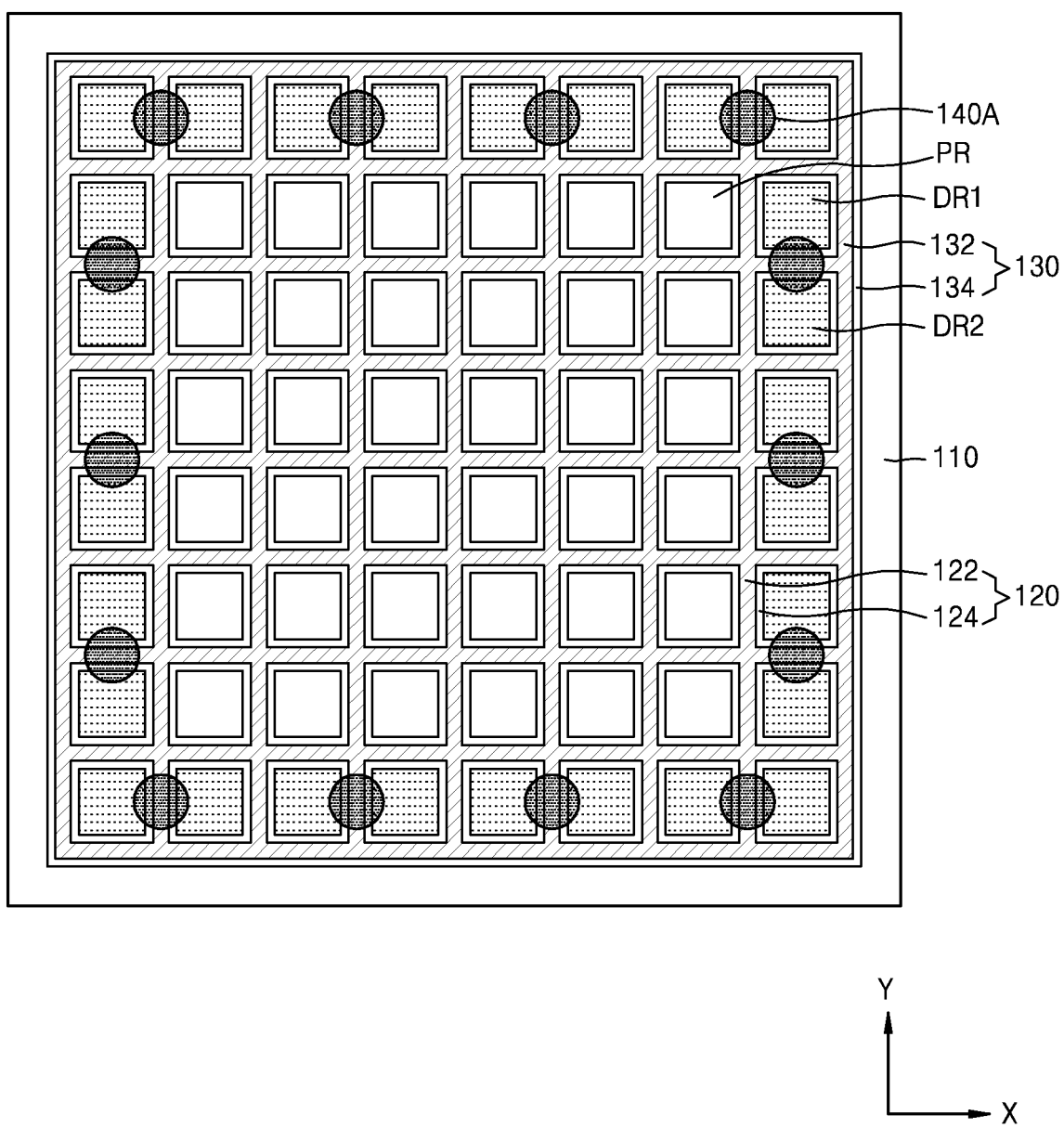
FIG. 5 is a layout of an image sensor according to example embodiments.

FIG. 5 is a layout of a second image sensor 100A according to example embodiments. In FIG. 5, the same reference numerals like in FIGS. 1 through 4 denote the same elements.

Referring to FIG. 5, the plurality of pixel regions PR may be arranged in a matrix form along the first direction (the X direction) and the second direction (the Y direction), and a plurality of pairs of dummy pixel regions DR1 and DR2 may be arranged at a periphery of (or at edges of) the plurality of pixel regions PR to surround the same. A plurality of pixel separation contacts 140A may be spaced apart from each other at a predetermined interval around the plurality of pixel regions PR, and may be disposed to overlap the plurality of pairs of dummy pixel regions DR1 and DR2 and the dummy pixel separation structure 130 between each of the pairs of the plurality of dummy pixel regions DR1 and DR2.

Figure 6:
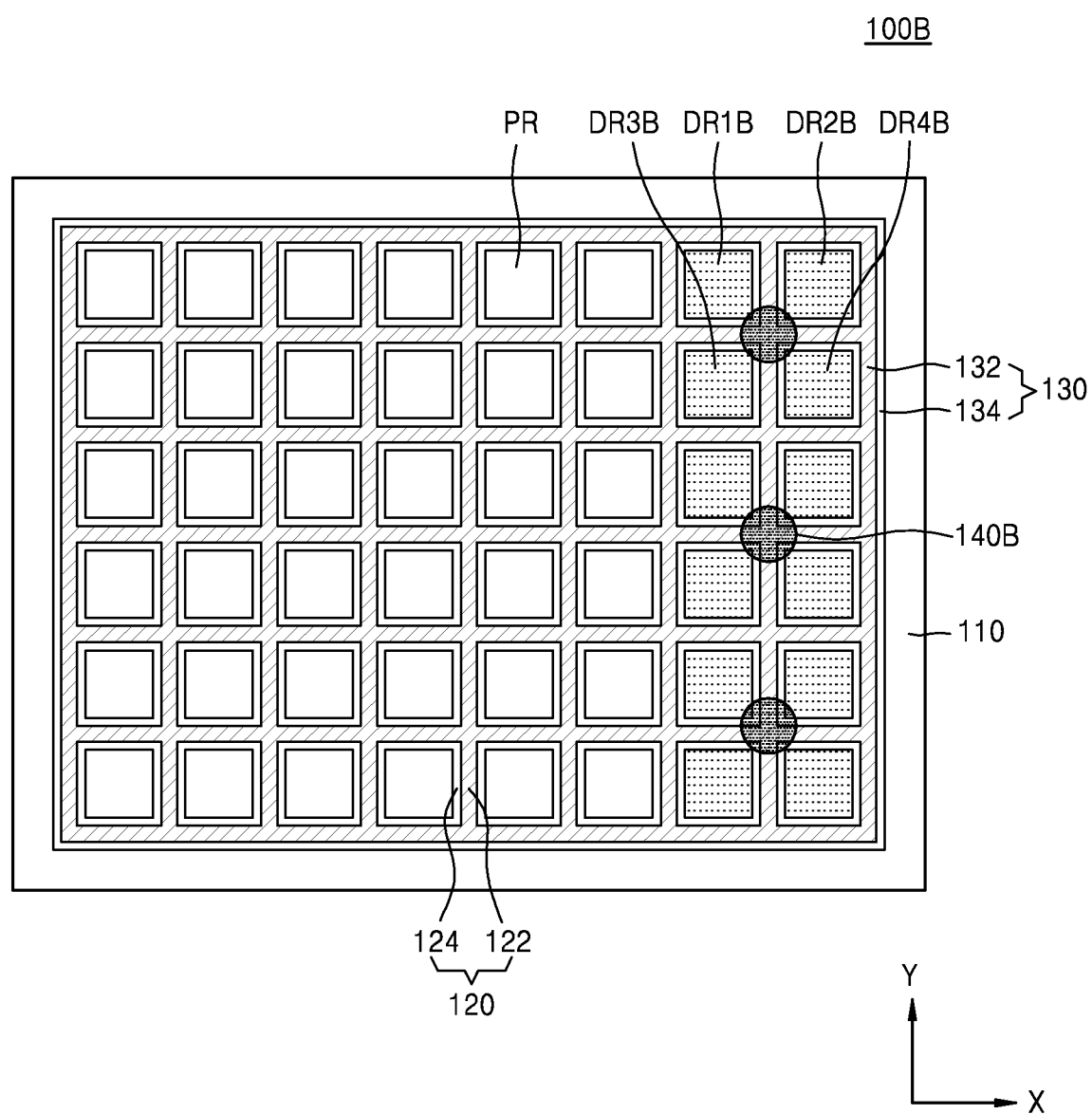
FIG. 6 is a layout of an image sensor according to example embodiments.

FIG. 6 is a layout of a third image sensor 100B according to example embodiments. In FIG. 6, the same reference numerals like in FIGS. 1 through 5 denote the same elements.

Referring to FIG. 6, the plurality of pixel regions PR may be arranged in a matrix form along the first direction (the X direction) and the second direction (the Y direction), and first dummy pixel region DR1B, second dummy pixel region DR2B, third dummy pixel region DR3B, and fourth dummy pixel region DR4B may be arranged on one side of the plurality of pixel regions PR. For example, the first dummy pixel region DR1B, second dummy pixel region DR2B, third dummy pixel region DR3B, and fourth dummy pixel region DR4B may be arranged in a 2×2 matrix form, and a pixel separation contact 140B may be disposed to contact all of the first dummy pixel region DR1B, second dummy pixel region DR2B, third dummy pixel region DR3B, and fourth dummy pixel region DR4B.

The pixel separation contact 140B may be disposed to overlap the dummy pixel separation structure 130 at two locations which are intersecting in the first direction (the X direction) and the second direction (the Y direction). Therefore, even if misalignment occurs due to a tolerance in a process of forming the pixel separation contact 140B, a stable electrical connection between the pixel separation contact 140B and the two of the dummy pixel separation structure 130 may still be formed.

FIG. 6 illustratively shows that the first dummy pixel region DR1B, second dummy pixel region DR2B, third dummy pixel region DR3B, and fourth dummy pixel region DR4B are arranged on one side of the plurality of pixel regions PR (that is, on the right side of the plurality of pixel regions PR when viewed from an upper surface). However, the first dummy pixel region DR1B, second dummy pixel region DR2B, third dummy pixel region DR3B, and fourth dummy pixel region DR4B may be arranged on two sides, three sides, or all sides of the plurality of pixel regions PR.

Figure 7:
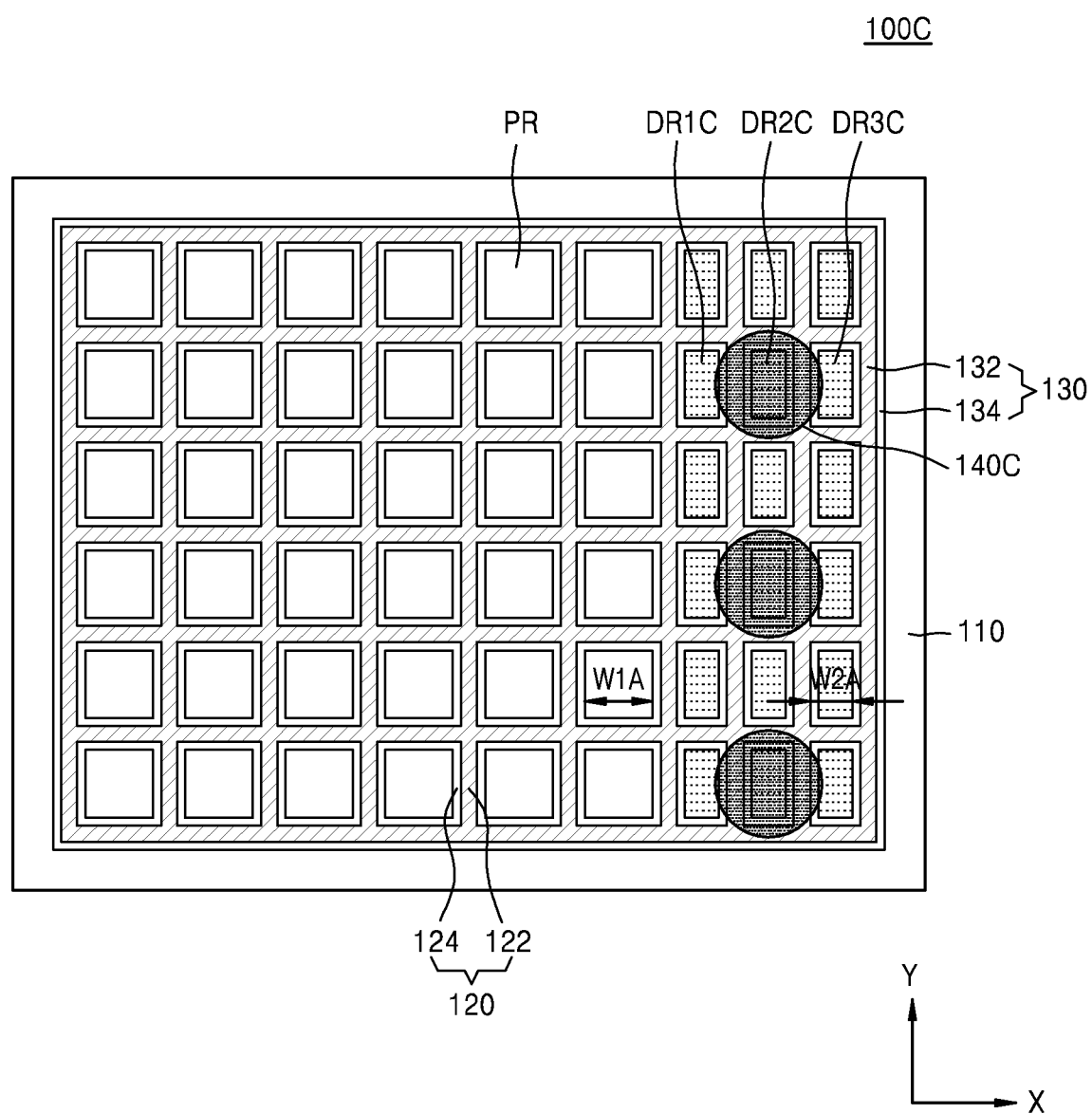
FIG. 7 is a layout of an image sensor according to example embodiments.

FIG. 7 is a layout of a fourth image sensor 100C according to example embodiments. In FIG. 7, the same reference numerals like in FIGS. 1 through 6 denote the same elements.

Referring to FIG. 7, the first dummy pixel region DR1C, the second dummy pixel region DR2C, and the third dummy pixel region DR3C, may be arranged in a row or continuously along the first direction (the X direction). The plurality of pixel regions PR have a first width W1A along the first direction (the X direction), and each of the first dummy pixel region DR1C, the second dummy pixel region DR2C, and the third dummy pixel region DR3C has a second width W2A along the first direction (the X direction), wherein a second length of the second width W2A may be equal to or less than a first length of the first width W1A.

As illustratively shown in 7, a pixel separation contact 140C may be disposed to overlap at least some the first dummy pixel region DR1C, the second dummy pixel region DR2C, and the third dummy pixel region DR3C. The pixel separation contact 140C may be electrically connected to the two of the dummy pixel separation structure 130 interposed between the first dummy pixel region DR1C, the second dummy pixel region DR2C, and the third dummy pixel region DR3C. Therefore, even if misalignment occurs due to a tolerance in a process of forming the pixel separation contact 140C, a stable electrical connection between the pixel separation contact 140C and the two of the dummy pixel separation structure 130 may still be formed.

Figure 8:
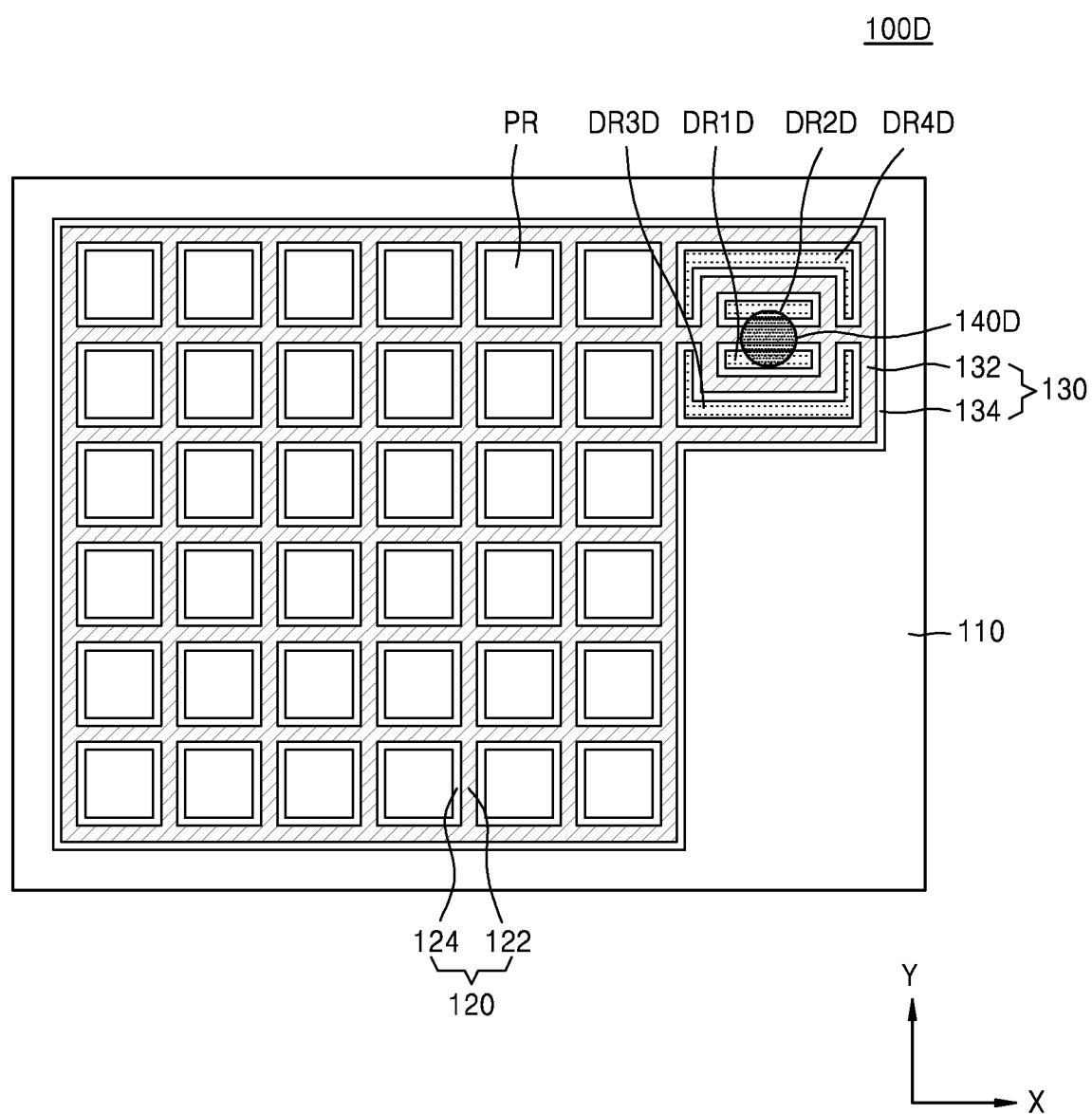
FIG. 8 is a layout of an image sensor according to example embodiments.

FIG. 8 is a layout of a fifth image sensor 100D according to example embodiments. In FIG. 8, the same reference numerals like in FIGS. 1 through 7 denote the same elements.

Referring to FIG. 8, first dummy pixel region DR1D, second dummy pixel region DR2D, third dummy pixel region DR3D, and fourth dummy pixel region DR4D, may be arranged in a row in the second direction (the Y direction), and the third dummy pixel region DR3D and the fourth dummy pixel region DR4D may be arranged to surround the first dummy pixel region DR1D and the second dummy pixel region DR2D.

A pixel separation contact 140D may be disposed to overlap at least two of the first dummy pixel region DR1D, the second dummy pixel region DR2D, the third dummy pixel region DR3D, and the fourth dummy pixel region DR4D. For example, as shown in FIG. 8, the pixel separation contact 140D may be disposed to overlap the first dummy pixel region DR1D and the second dummy pixel region DR2D. Thus, even if misalignment occurs in a process of forming the pixel separation contact 140D (for example, even if the pixel separation contact 140D deviates from the intended position thereof shown in FIG. 8), the pixel separation contact 140D may be disposed to overlap at least some of the third dummy pixel region DR3D and the fourth dummy pixel region DR4D. Therefore, even if misalignment occurs due to a tolerance in the process of forming the pixel separation contact 140D, a stable electrical connection between the pixel separation contact 140D and the first dummy pixel region DR1D, the second dummy pixel region DR2D, the third dummy pixel region DR3D, and the fourth dummy pixel region DR4D may still be formed.

FIG. 8 illustratively shows that the first dummy pixel region DR1D, second dummy pixel region DR2D, third dummy pixel region DR3D, and fourth dummy pixel region DR4D are arranged on one side of the plurality of pixel regions PR (that is, on the right side of the plurality of pixel regions PR when viewed from an upper surface). However, the first dummy pixel region DR1D, second dummy pixel region DR2D, third dummy pixel region DR3D, and fourth dummy pixel region DR4D may be arranged on two sides, three sides, or all sides of the plurality of pixel regions PR.

Figure 9:
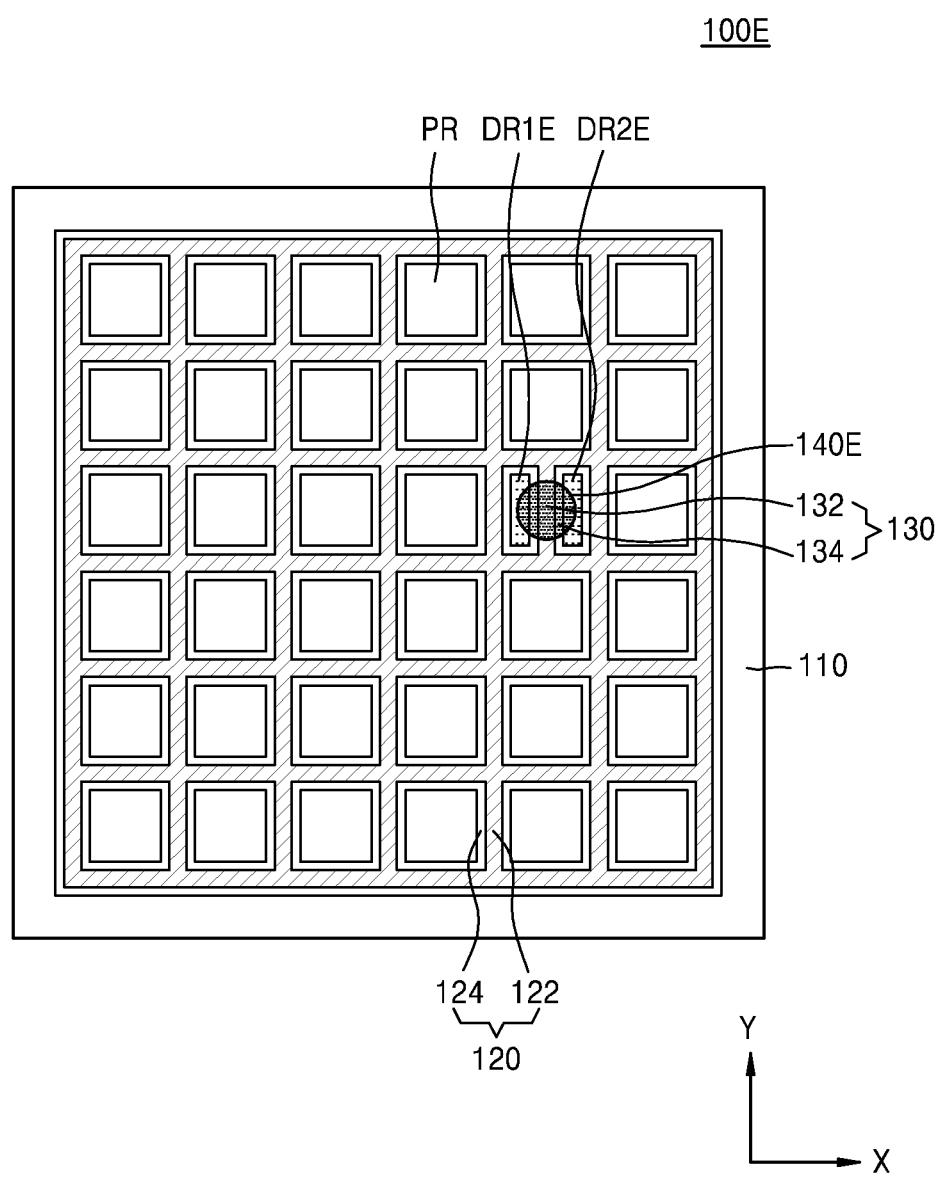
FIG. 9 is a layout of an image sensor according to example embodiments.

FIG. 9 is a layout of a sixth image sensor 100E according to example embodiments. In FIG. 9, the same reference numerals like in FIGS. 1 through 8 denote the same elements.

Referring to FIG. 9, the plurality of pixel regions PR may be arranged in a matrix form along the first direction (the X direction) and the second direction (the Y direction), and a plurality of pairs of dummy pixel regions DR1E and DR2E may be arranged to replace one of the plurality of pixel regions PR. In an exemplary embodiment, the plurality of pixel regions PR may be arranged in one partial matrix form and the plurality of pairs of dummy pixel regions DR1E and DR2E may be arranged in another partial matrix form so that the plurality of pixel regions PR and the plurality of pairs of dummy pixel regions DR1E and DR2E collectively form a complete matrix form.

For example, the plurality of pixel regions PR may be arranged to surround the pair of dummy pixel regions DR1E and DR2E when viewed from an upper surface of the substrate 110. A pixel separation contact 140E may be disposed to overlap the pair of dummy pixel regions DR1E and DR2E and the dummy pixel separation structure 130 interposed therebetween. Therefore, even if misalignment occurs due to a tolerance in a process of forming the pixel separation contact 140E, a stable electrical connection between the pixel separation contact 140E and the pair of dummy pixel regions DR1E and DR2E may still be formed.

Although only one pair of dummy pixel regions DR1E and DR2E is illustratively shown in FIG. 9, the number of the dummy pixel regions DR1E and DR2E is not limited thereto.

Figure 10:
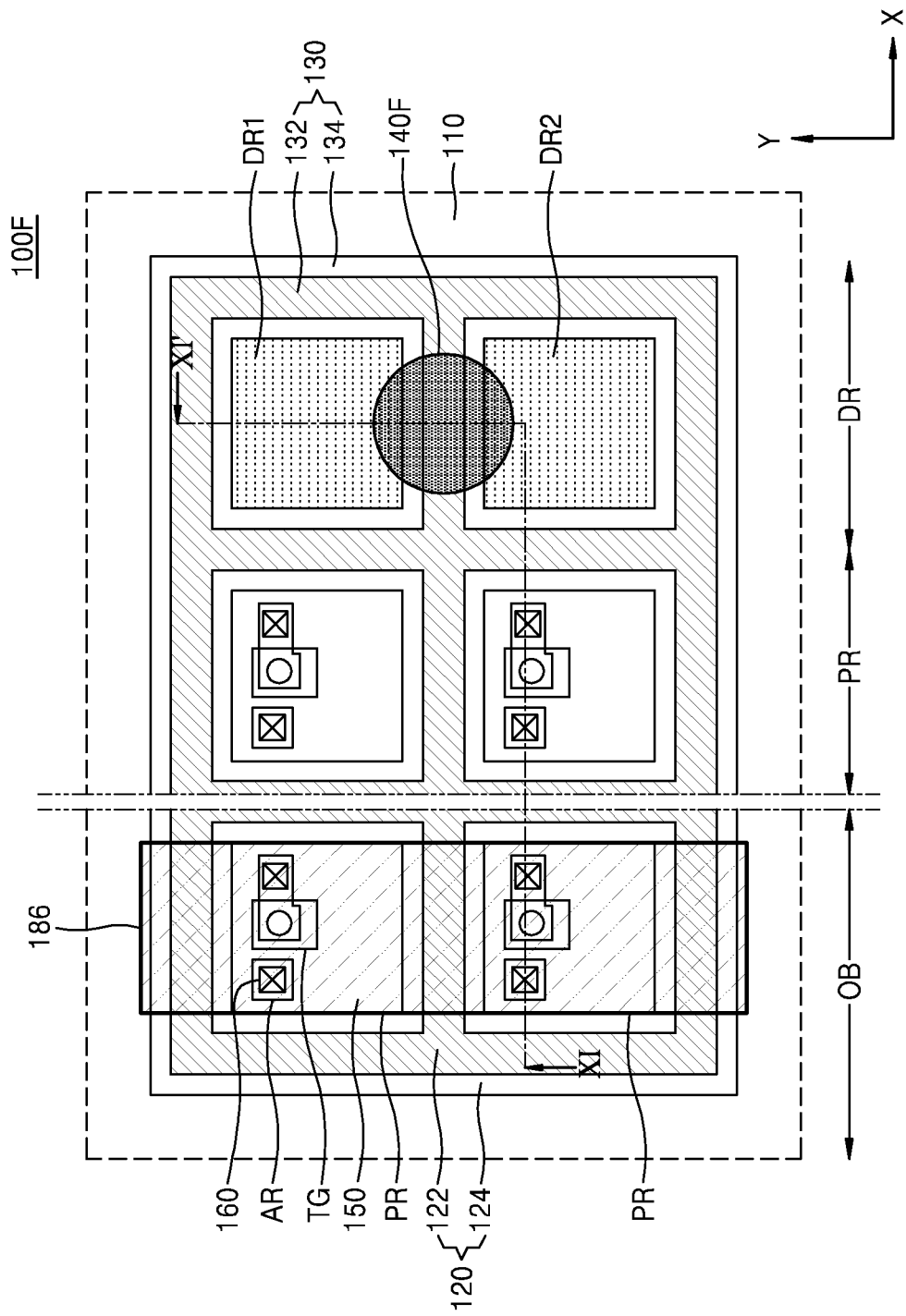
FIG. 10 is an enlarged layout of an image sensor according to example embodiments.
Figure 11:
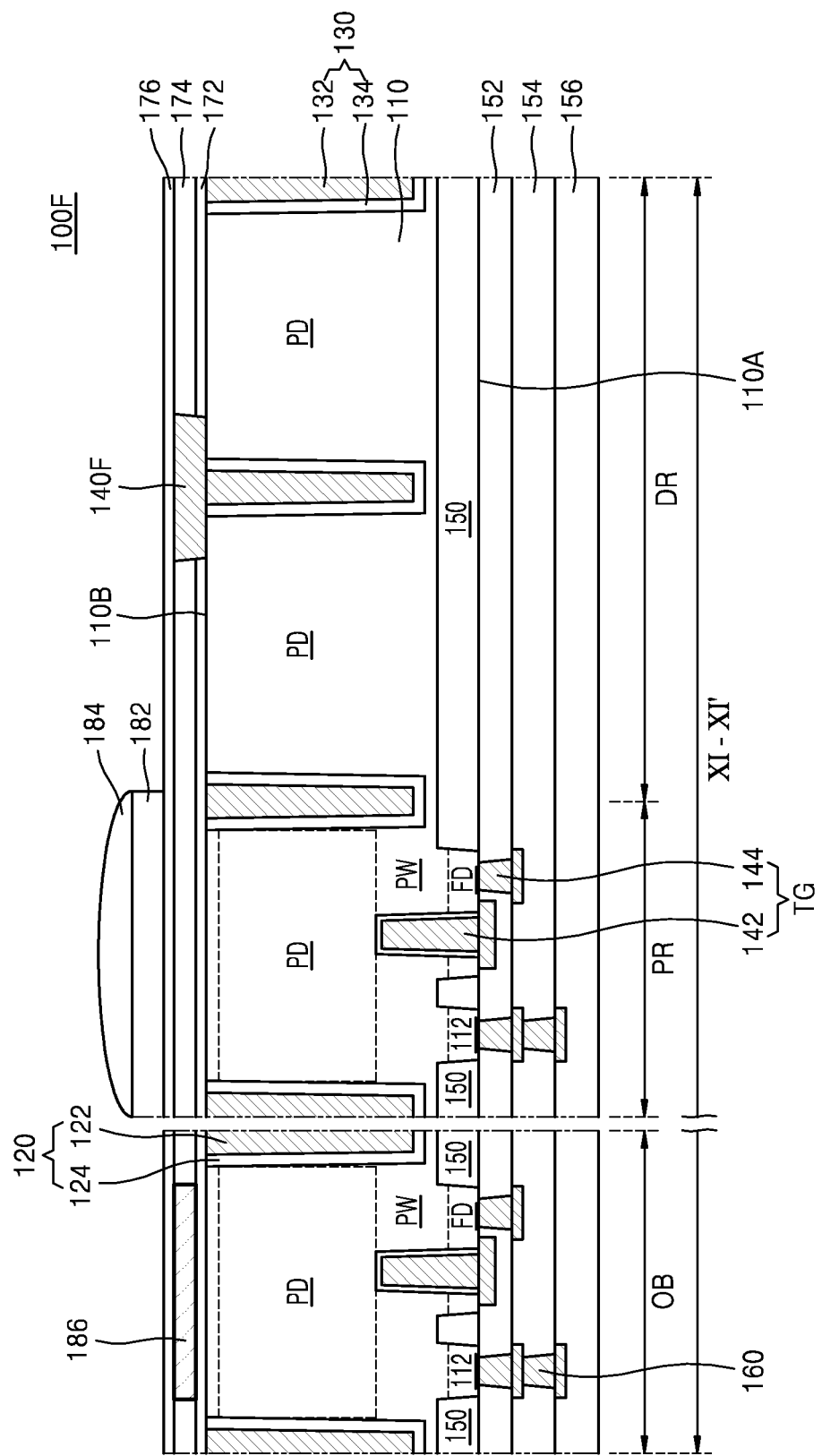
FIG. 11 is a cross-sectional view taken along line XI-XI' of FIG. 10.

FIG. 10 is a layout of a seventh image sensor 100F according to example embodiments. FIG. 11 is a cross-sectional view taken along line XI-XI' of FIG. 10. In FIGS. 10 and 11, the same reference numerals like in FIGS. 1 through 9 denote the same elements.

Referring to FIGS. 10 and 11, the substrate 110 may include the plurality of pixel regions PR, the pair of dummy pixel regions DR1 and DR2, and an optical black region OB.

The optical black region OB may have a similar structure to each of the plurality of pixel regions PR but may include a light shielding pattern 186 instead of the color filter 182 and the micro lens 184. For example, the light shielding pattern 186 may be disposed at a location where a part of the sixth insulating layer 174 is removed. The light shielding pattern 186 may include a metal material such as tungsten.

The optical black region OB may function as a reference pixel for the plurality of pixel regions PR. For example, the light shielding pattern 186 may block light from entering a unit pixel in the optical black region OB. A reference charge amount that can be generated from the photoelectric conversion unit PD in which light is blocked is measured and compared with a sensing charge amount generated from the plurality of pixel regions PR, so that a light signal input from the plurality of pixel regions PR may be calculated from a difference between the sensing charge amount and the reference charge amount.

As illustratively shown in FIG. 11, the pixel separation structure 120 and the dummy pixel separation structure 130 may extend from the second surface 110B of the substrate 110 to the inside of the substrate 110 to a depth close to the first surface 110A of the substrate 110. The pixel separation structure 120 and the dummy pixel separation structure 130 may not contact the first surface 110A of the substrate 110.

In an example process for forming the seventh image sensor 100F, the second surface 110B may be removed by a predetermined thickness by a grinding process after forming the connection contact 160, and the recessed gate structure 142 and planar gate structure 144 on the first surface 110A of the substrate 110. Thereafter, when a contact hole (not shown) for forming the pixel separation structure 120 and the dummy pixel separation structure 130 is formed from the second surface 110B of the substrate 110, the pixel separation structure 120 and the dummy pixel separation structure 130 illustratively shown in FIG. 11 may be obtained.

In example embodiments, a pixel separation contact 140F is formed on the second surface 110B of the substrate 110 and may be covered by the antireflection layer 172, the sixth insulating layer 174 and the seventh insulating layer 176. The pixel separation contact 140F may be formed by the same process as the process of forming the light shielding pattern 186. The pixel separation contact 140F may include the same material as the light shielding pattern 186. However, the example embodiment is not limited thereto. For example, unlike FIG. 11, the pixel separation contact 140F may be formed on the first surface 110A of the substrate 110 and the third insulating layer 152, the fourth insulating layer 154, and the fifth insulating layer 156 may be formed on the first surface 110A of the substrate 110 to cover the pixel separation contact 140F.

Figure 12:
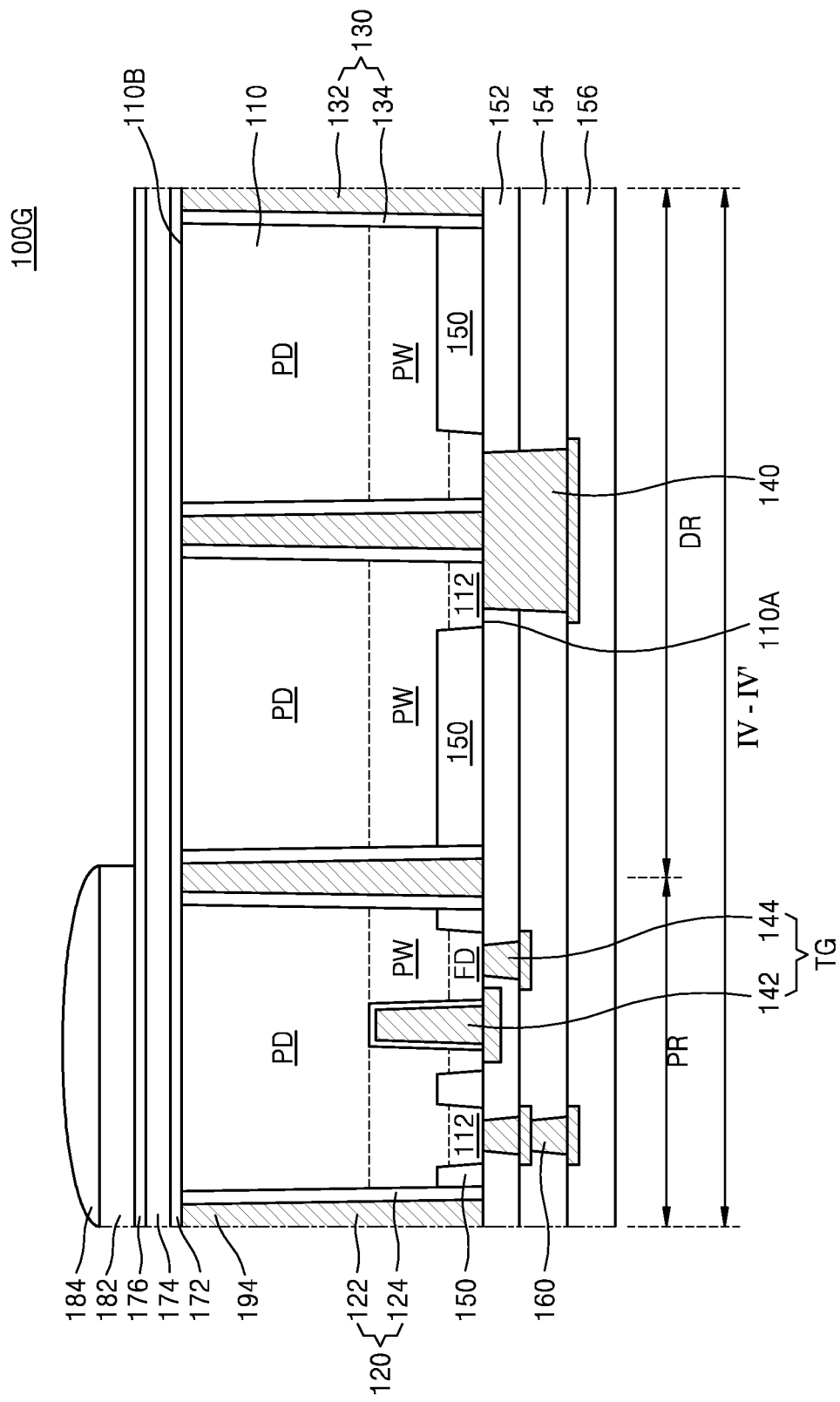
FIG. 12 is a cross-sectional view of an image sensor according to example embodiments.

FIG. 12 is a cross-sectional view of eighth image sensor 100G according to example embodiments. FIG. 12 illustrates a section corresponding to the section taken along line IV-IV' of FIG. 3. In FIG. 12, the same reference numerals like in FIGS. 1 through 11 denote the same elements.

Referring to FIG. 12, the pixel separation structure 120 and the dummy pixel separation structure 130 may be formed over the entire depth of the substrate 110. For example, the pixel separation structure 120 and the dummy pixel separation structure 130 may be formed over the entire depth of the substrate 110 to extend from the first surface 110A to the second surface 110B of the substrate 110.

For example, the pixel separation structure 120 may have an upper surface located at the same level as the second surface 110B of the substrate 110, and the upper surface of the pixel separation structure 120 may contact the antireflection layer 172. FIG. 12 illustratively shows that both the first conductive layer 122 and the first insulating layer 124 of the pixel separation structure 120 contact the antireflection layer 172, but the example embodiment is not limited thereto. Unlike FIG. 12, the first insulating layer 124 may extend between the first conductive layer 122 and the antireflection layer 172 to surround the whole side wall and upper surface of the first conductive layer 122, and thus, the first conductive layer 122 may not directly contact the antireflection layer 172.

FIGS. 13 through 17 are cross-sectional views for explaining a method of manufacturing a ninth image sensor 100H according to example embodiments. FIGS. 13 through 17 illustrate sections corresponding to the section taken along line IV-IV' of FIG. 3, in processing order. In FIGS. 13 through 17, the same reference numerals like in FIGS. 1 through 12 denote the same elements.

Figure 13:
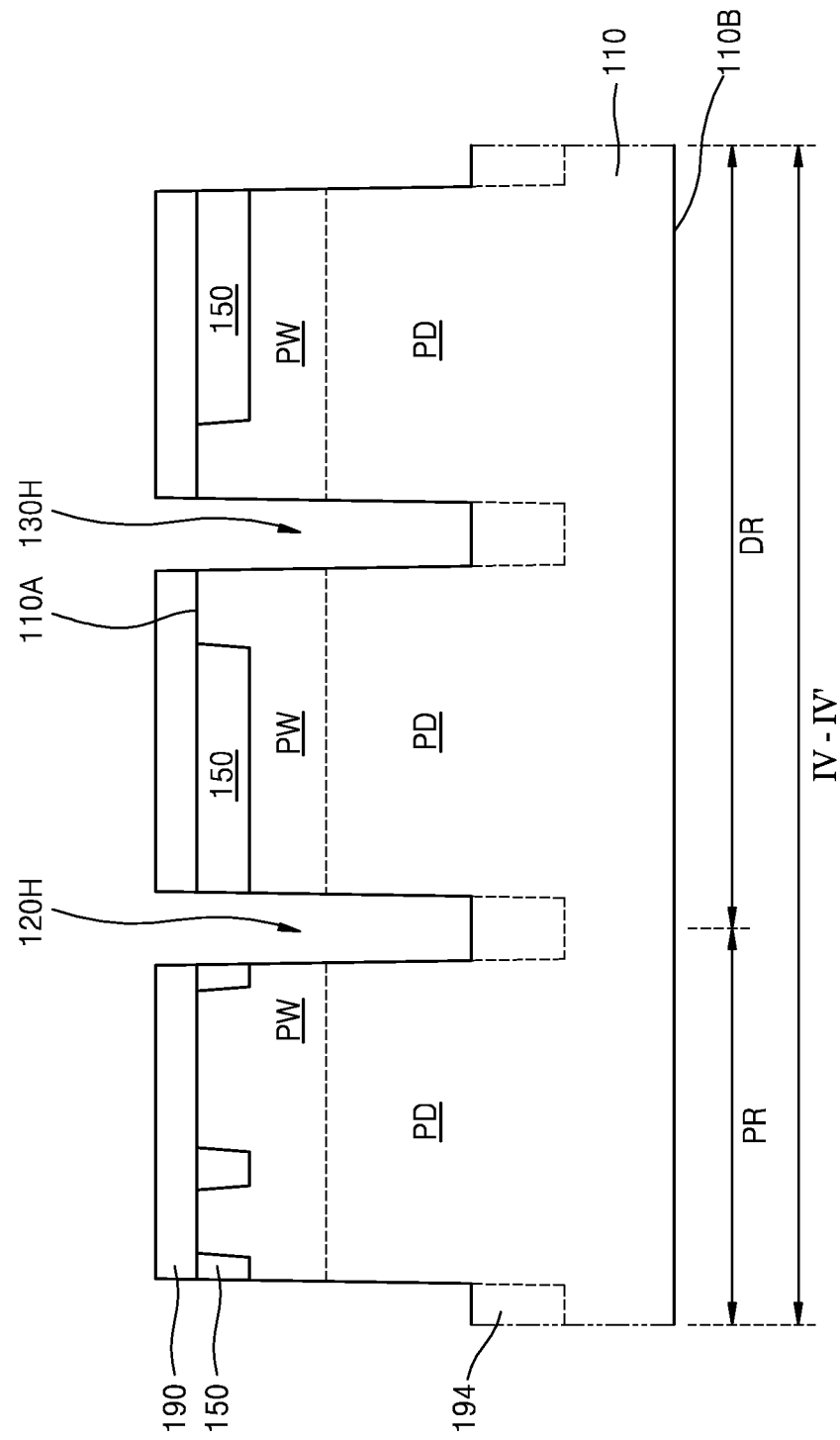
FIGS. 13 through 17 are cross-sectional views for explaining a method of manufacturing an image sensor according to example embodiments.

Referring to FIG. 13, the substrate 110 having the first surface 110A and the second surface 110B opposite to each other is prepared. The substrate 110 may include a P-type semiconductor substrate. For example, the substrate 110 may be a P-type silicon substrate. In example embodiments, the substrate 110 may include a P-type bulk substrate and a P-type or N-type epitaxial layer grown thereon. Alternatively, the substrate 110 may include an N-type bulk substrate and a P-type or N-type epitaxial layer grown thereon. Alternatively, the substrate 110 may be an organic plastic substrate.

The photoelectric conversion unit PD and the well region PW may be formed from the first surface 110A of the substrate 110 by an ion implantation process. For example, the photoelectric conversion unit PD may be formed by doping an N-type impurity, and the well region PW may be formed by doping a P-type impurity.

A first mask pattern may be formed on the first surface 110A of the substrate 110 and an isolation trench (not shown) may be formed by etching the substrate 110 from the first surface 110A using the first mask pattern as an etch mask. Thereafter, an insulating film (not shown) for filling the isolation trench may be formed on the first surface 110A of the substrate 110 and the isolation layer 150 may be formed in the isolation trench by planarizing an upper surface of the insulating layer until the first surface 110A of the substrate 110 is exposed.

Thereafter, second mask pattern 190 may be formed on the first surface 110A of the substrate 110 and a pixel separation trench 120H and a dummy pixel separation trench 130H may be formed by etching the substrate 110 from the first surface 110A using the second mask pattern 190 as an etch mask.

An impurity region 194 may be formed in each bottom portion of the pixel separation trench 120H and the dummy pixel separation trench 130H by performing an ion implantation process on the substrate 110.

Figure 14:
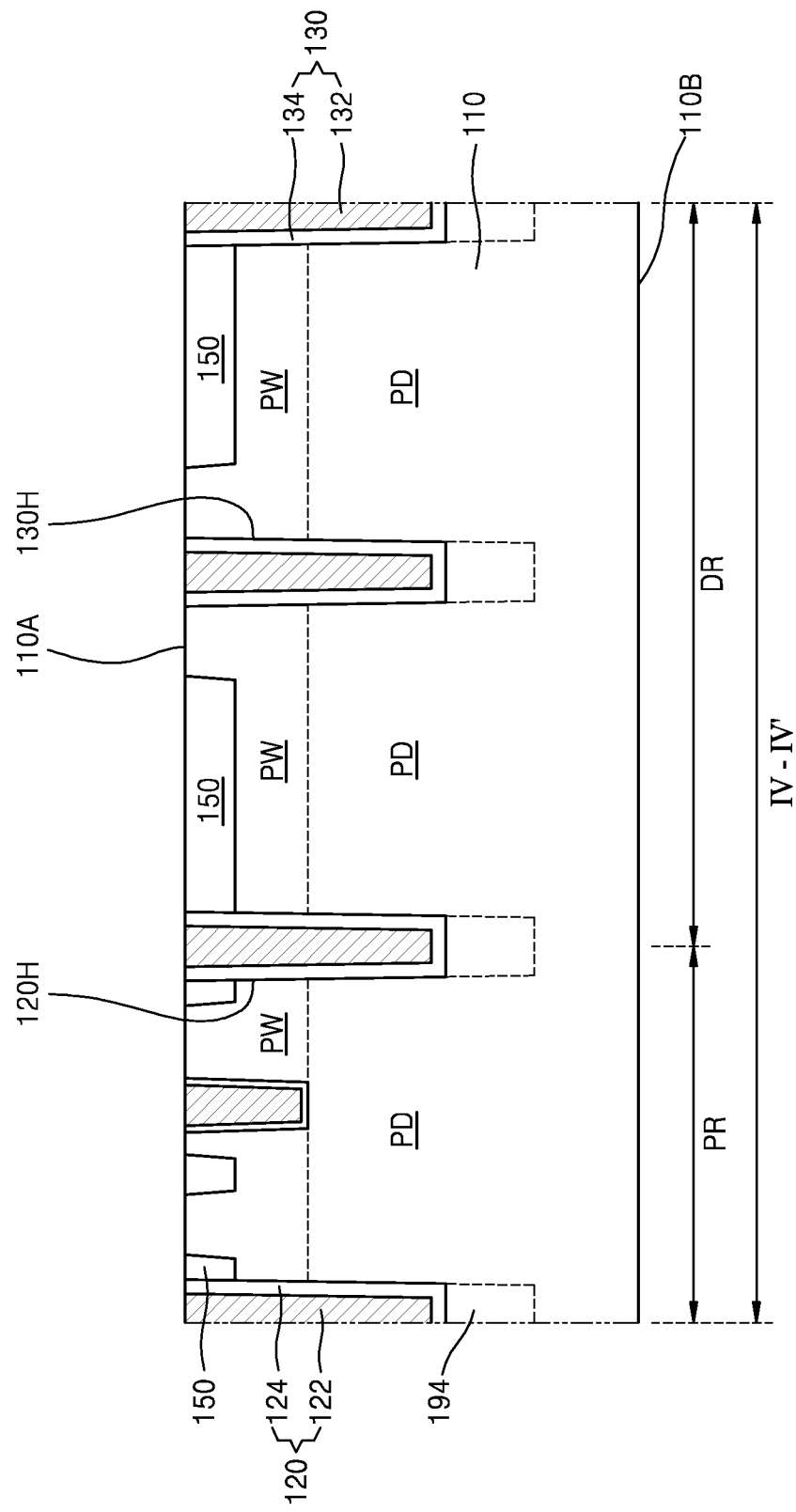

Referring to FIG. 14, the second mask pattern 190 (see FIG. 13) may be removed.

The first insulating layer 124 and the second insulating layer 134 may be respectively formed on inner walls of the pixel separation trench 120H and the dummy pixel separation trench 130H by conformally forming an insulating layer on the first surface 110A of the substrate 110. Thereafter, a conductive layer (not shown) may be formed on the first surface 110A of the substrate 110 to fill the pixel separation trench 120H and the dummy pixel separation trench 130H, and subsequently, the conductive layer may be removed until the substrate 110 is exposed again to form the first conductive layer 122 and the second conductive layer 132 in the pixel separation trench 120H and the dummy pixel separation trench 130H, respectively. As a result, the pixel separation structure 120 including the first conductive layer 122 and the first insulating layer 124 is formed in the pixel separation trench 120H and the dummy pixel separation structure 130 including the second conductive layer 132 and the second insulating layer 134 is formed in the dummy pixel separation trench 130H. A layout of the pixel separation structure 120 and the dummy pixel separation structure 130 may be the same as those described above with reference to FIGS. 2 through 12.

Figure 15:
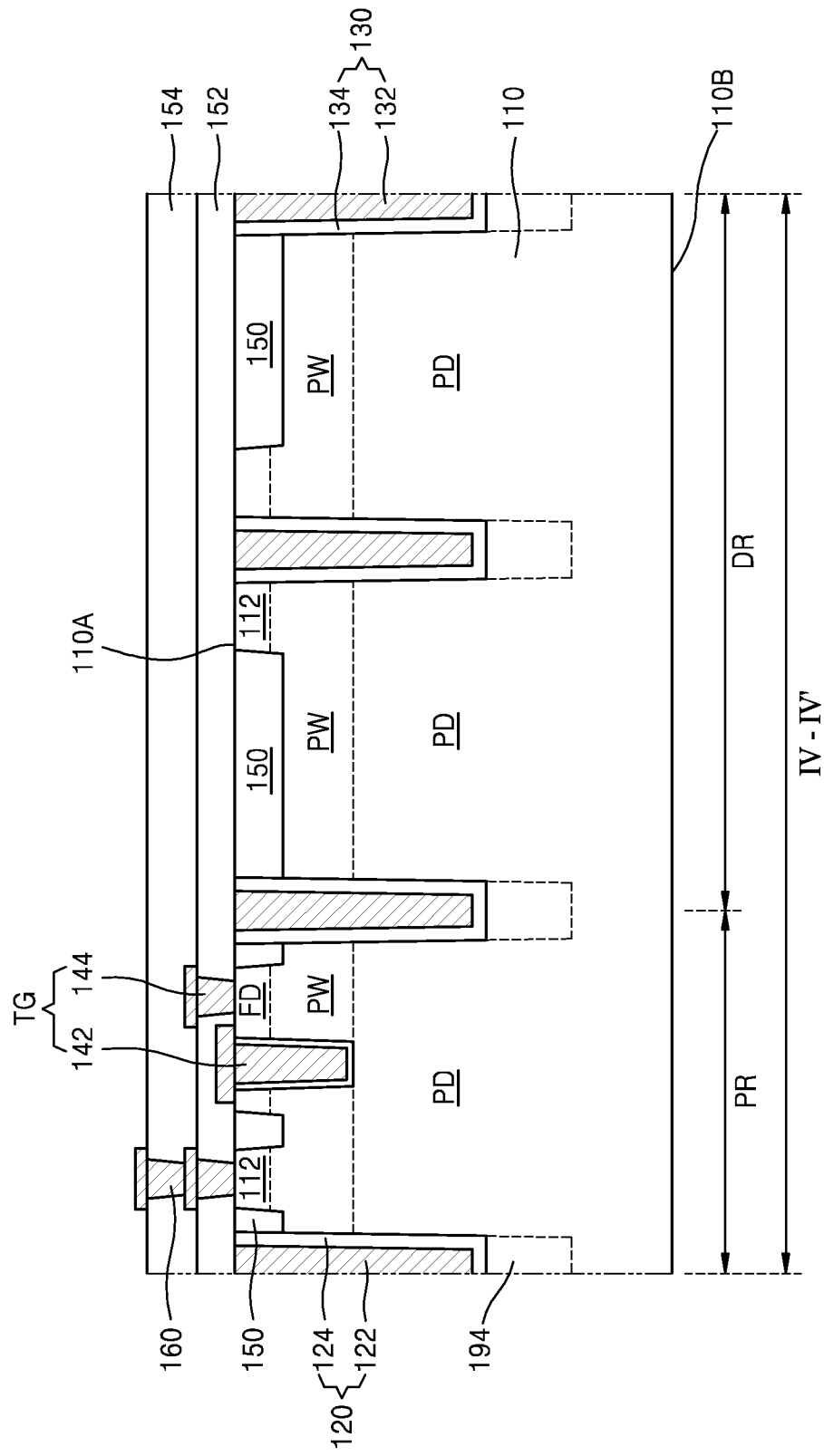

Referring to FIG. 15, the gate TG of the transmission transistor Tx may be formed on the first surface 110A of the substrate 110 and the floating diffusion region FD and the impurity region 112 may be formed by an ion implantation process. The gate TG of the transmission transistor Tx may have a variety of structural features including the recessed gate structure 142 extending from the first surface 110A of the substrate 110 into the substrate 110 and the planar gate structure 144 formed on the first surface 110A of the substrate 110.

Thereafter, the third insulating layer 152 and the fourth insulating layer 154 and the connection contact 160 may be formed on the first surface 110A of the substrate 110.

Referring to FIG. 16, some of the third insulating layer 152 and the fourth insulating layer 154 may be etched to form a pixel separation contact hole (not shown) exposing the impurity region 112 of the dummy pixel region DR. Thereafter, a conductive layer (not shown) is formed on the third insulating layer 152 and the fourth insulating layer 154 to fill the pixel separation contact hole, and an upper portion of the conductive layer is planarized to form the pixel separation contact 140 in the pixel separation contact hole.

As described above with reference to FIGS. 2 through 12, the pixel separation contact 140 may be formed on the impurity region 112 of an adjacent pair of dummy pixel regions DR and the dummy pixel separation structure 130 between the adjacent pair of dummy regions DR. Therefore, even if misalignment occurs due to a tolerance in a mask forming process for forming the pixel separation contact hole, an electrical short between the pixel separation contact 140 and the plurality of pixel regions PR may be prevented.

In addition, when a contact having a width less than that of the pixel separation structure 120 is formed, a process for forming a contact having a relatively small width is complicated and scaling down of the pixel region is difficult. However, according to the above-described method, a fourth length of the fourth width W4 (see FIG. 3) of the pixel separation contact 140 may be greater than a fifth length of the fifth width W5 of the pixel separation structure 120 (see FIG. 3). Accordingly, the above-described method may form the pixel separation contact 140 that is relatively large, by an uncomplicated process and simultaneously may be advantageous for scaling down of the pixel region.

Thereafter, the fifth insulating layer 156 may be formed on the fourth insulating layer 154 and the pixel separation contact 140.

Figure 17:
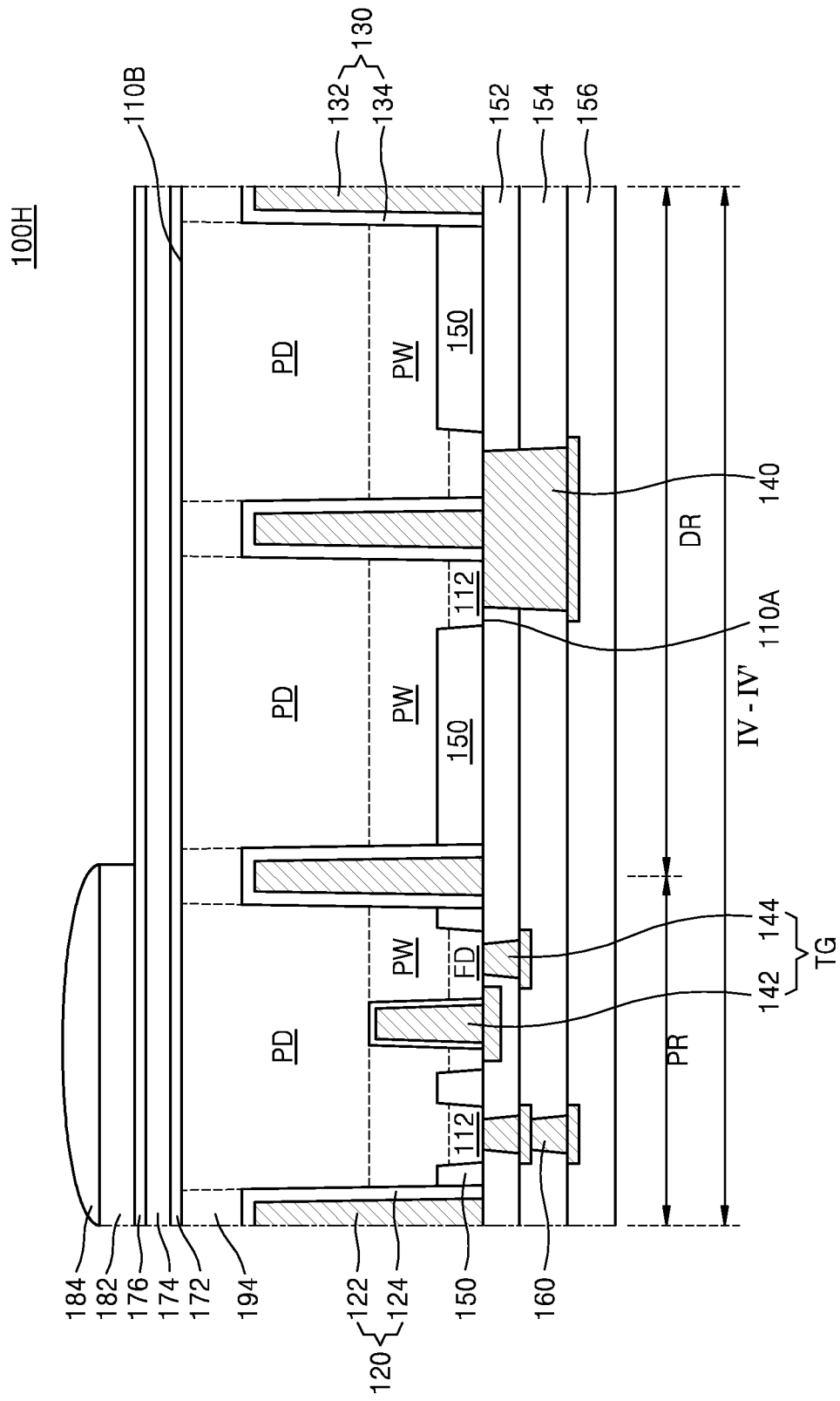

Referring to FIG. 17, the substrate 110 may be prepared in an opposite way to that described with reference to FIG.

13 such that the second surface 110B of the substrate 110 faces upward and the first surface 110A of the substrate 110 faces downward. The upper surface of the substrate 110 is removed from the second surface 110B of the substrate 110 by a first thickness TB (see FIG. 16), and the impurity region 194 may be exposed from the second surface 110B of the substrate 110.

Accordingly, the pixel separation structure 120 and the impurity region 194 may electrically isolate each of the plurality of pixel regions PR from adjacent pixel regions PR.

Thereafter, the antireflection layer 172 and sixth insulating layer 174 and the seventh insulating layer 176 may be formed on the second surface 110B of the substrate 110 and the color filter 182 and the micro lens 184 may be formed on the plurality of pixel regions PR.

The ninth image sensor 100H may be completed by the above-described process.

Unlike FIG. 17, the substrate 110 may be further removed from the second surface 110B of the substrate 110 until upper surfaces of the pixel separation structure 120 and the dummy pixel separation structure 130 are exposed by an etching process or a planarization process. In this case, the eighth image sensor 100G of FIG. 12 may be formed.

While the example embodiment has been particularly shown and described with reference to example embodiments thereof, it will be understood that various changes in form and details may be made therein without departing from the spirit and scope of the following claims.

What is claimed is:

1. An image sensor comprising:
a substrate comprising a plurality of pixel regions, a first surface and a second surface opposite to the first surface;
a first pixel separation structure surrounded by the plurality of pixel regions when viewed from the second surface of the substrate; and
a second pixel separation structure surrounded by the plurality of pixel regions when viewed from the second surface of the substrate and electrically connected to the first pixel separation structure;
a first pixel separation contact disposed on the second pixel separation structure,
wherein the first pixel separation contact is configured to receive a negative voltage and the negative voltage is supplied to the first pixel separation structure through the first pixel separation contact and the second pixel separation structure,
wherein the second pixel separation structure has a first width along a first direction viewed from the second surface and the first pixel separation contact has a second width along the first direction, and
wherein a length of the second width is equal to or greater than a length of the first width.

2. The image sensor of claim 1, further comprises a third pixel separation structure, a fourth pixel separation structure, and a second pixel separation contact disposed on the third pixel separation structure,
wherein the second pixel separation contact is configured to receive the negative voltage and the negative voltage is supplied to the fourth pixel separation structure through the second pixel separation contact and the third pixel separation structure, and
wherein the first to fourth pixel separation structures are disposed along the first direction.

3. The image sensor of claim 2, further comprises a plurality of micro lenses disposed on the first surface, and wherein the first and second pixel separation contacts are disposed on the second surface.

4. The image sensor of claim 3, wherein the first to fourth pixel separation structures are connected the first surface.

5. The image sensor of claim 4, wherein the first to fourth pixel separation structures are connected to the first surface and the second surface.

6. The image sensor of claim 4, further comprises a fifth pixel separation structure, a sixth pixel separation structure and a third pixel separation contact disposed on the fifth pixel separation structure,
wherein the third pixel separation contact is configured to receive the negative voltage, and
wherein the sixth pixel separation structure, the fifth pixel separation structure and the second pixel separation structure are disposed along a second direction perpendicular to the first direction viewed from the second surface of the substrate.

7. An image sensor comprising:
a substrate comprising a plurality of pixel regions, a first surface and a second surface opposite to the first surface;
a first pixel separation structure surrounded by the plurality of pixel regions when viewed from the second surface of the substrate; and
a second pixel separation structure surrounded by the plurality of pixel regions when viewed from the second surface of the substrate and electrically connected to the first pixel separation structure;
a first pixel separation contact disposed on the second pixel separation structure,
wherein the first pixel separation contact is configured to receive a negative voltage and the negative voltage is supplied to the first pixel separation structure through the first pixel separation contact and the second pixel separation structure,
wherein a plurality of micro lenses are disposed on the first surface, and
wherein the first pixel separation contact is disposed on the second surface, and overlaps a first pixel region and a second pixel region, from among the plurality of pixel regions, along a direction perpendicular to the first surface of the substrate.

8. The image sensor of claim 7, further comprises a plurality of pixel separation contacts including the first pixel separation contact,
wherein the first and second pixel separation structures are sequentially arranged along a first direction viewed from viewed from the second surface, and
wherein the plurality of pixel separation contacts are sequentially arranged along a second direction perpendicular to the first direction viewed from the second surface.

9. The image sensor of claim 7, wherein the first to second pixel separation structures are connected the first surface.

10. The image sensor of claim 8, wherein the first to second pixel separation structures are connected the first surface and the second surface.

11. The image sensor of claim 10, wherein the second pixel separation structure has a first width along the first direction viewed from the second surface and the first pixel separation contact has a second width along the first direction, and
wherein a length of the second width is equal to or greater than a length of the first width.

12. The image sensor of claim 7, wherein the first pixel separation contact and the second pixel separation structure overlap along the direction perpendicular to the first surface of the substrate.

13. An image sensor comprising:
- a substrate comprising a plurality of pixel regions arranged in a matrix form along a first direction and a second direction, a first surface and a second surface opposite to the first surface;
- a plurality of pixel separation structures disposed between the plurality of pixel regions;
- a plurality of pixel separation contacts on the second surface; and
- a plurality of micro lenses disposed on the first surface;
- wherein the plurality of pixel separation structures are configured to receive a negative voltage through the plurality of pixel separation contacts,
- wherein the plurality of pixel regions are configured to receive incident light and convert the received light into an electric signal,
- wherein the plurality of pixel separation contacts are surrounded by the plurality of pixel regions when viewed from the second surface of the substrate, and
- wherein the plurality of pixel regions comprises a first pixel region which overlaps a first pixel separation contact, among the plurality of pixel separation contacts, along a direction perpendicular to the first surface of the substrate.

14. The image sensor of claim 13, wherein the plurality of pixel separation structures are connected to the first surface.

15. The image sensor of claim 14, wherein the plurality of pixel separation structures are connected to the first surface and the second surface.

16. The image sensor of claim 15, wherein the plurality of pixel separation structures are arranged in the matrix form.

17. The image sensor of claim 16, wherein the plurality of pixel separation contacts are disposed on the plurality of pixel separation structures.

18. The image sensor of claim 13, wherein the plurality of pixel regions further comprises a second pixel region which overlaps the first pixel separation contact along the direction perpendicular to the first surface of the substrate.

19. The image sensor of claim 18, wherein the plurality of pixel regions further comprises a third pixel region which overlaps the first pixel separation contact along the direction perpendicular to the first surface of the substrate.

* * * * *